US012568581B2

(12) United States Patent
Nakashiba et al.

(10) Patent No.: US 12,568,581 B2
(45) Date of Patent: Mar. 3, 2026

(54) SEMICONDUCTOR DEVICE

(71) Applicant: RENESAS ELECTRONICS CORPORATION, Tokyo (JP)

(72) Inventors: Yasutaka Nakashiba, Tokyo (JP); Hiroshi Miyaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 708 days.

(21) Appl. No.: 17/887,184

(22) Filed: Aug. 12, 2022

(65) Prior Publication Data

US 2023/0065171 A1     Mar. 2, 2023

(30) Foreign Application Priority Data

Sep. 2, 2021    (JP) ................................. 2021-143219

(51) Int. Cl.
H05K 1/14          (2006.01)
H05K 1/02          (2006.01)
          (Continued)

(52) U.S. Cl.
CPC ........... H05K 1/144 (2013.01); H05K 1/0298 (2013.01); H05K 1/111 (2013.01); H05K 1/181 (2013.01);
          (Continued)

(58) Field of Classification Search
CPC . H01L 25/074; H01L 25/0657; H01L 25/043; H01L 25/117; H01L 24/05; H01L 24/16; H01L 24/32; H01L 24/73; H01L 24/48;

H01L 24/92; H01L 23/49575; H01L 23/62; H01L 23/5227; H01L 2224/0401; H01L 2224/04042; H01L 2224/04073;
(Continued)

(56) References Cited

U.S. PATENT DOCUMENTS 9,558,967 B2    1/2017  Uchida et al.
2010/0264515 A1*  10/2010  Nakashiba .............. H01L 23/48
                                              257/734
(Continued)

FOREIGN PATENT DOCUMENTS

JP      2014-146780 A      8/2014
JP      2016-127162 A      7/2016

OTHER PUBLICATIONS

Office Action dated Oct. 1, 2024, from corresponding Japanese Application No. 2021-143219, 8 pages.

*Primary Examiner* — Julio J Maldonado
*Assistant Examiner* — Nathan Pridemore
(74) *Attorney, Agent, or Firm* — Rimon P.C.

(57)          ABSTRACT

A semiconductor device includes a first semiconductor chip in which a first multilayer wiring structure including a first coil and a second coil is formed and a second semiconductor chip in which a second multilayer wiring structure including a third coil and a fourth coil is formed. The second semiconductor chip is joined to the first semiconductor chip such that the first coil (second coil) and the third coil (fourth coil) are overlapped and the second semiconductor chip does not have an offset structure with respect to the first semiconductor chip. The second semiconductor chip is joined to the first semiconductor chip such that it is not overlapped with a pad for the first semiconductor chip and a pad for the second semiconductor chip.

9 Claims, 22 Drawing Sheets

(51) Int. Cl.
H05K 1/11 (2006.01)
H05K 1/18 (2006.01)
H05K 1/181 (2026.01)

(52) U.S. Cl.
CPC ................ *H05K 2201/0338* (2013.01); *H05K 2201/1003* (2013.01)

(58) Field of Classification Search
CPC . H01L 2224/05548; H01L 2224/05567; H01L 2224/16145; H01L 2224/32145; H01L 2224/32245; H01L 2224/48091; H01L 2224/48247; H01L 2224/48465; H01L 2224/73204; H01L 2224/73215; H01L 2224/73265; H01L 2224/92125; H01L 2225/06513; H01L 2225/06568; H01L 2924/00014; H01L 2924/10157; H01L 2924/181; H05K 1/144; H05K 1/0298; H05K 1/111; H05K 1/181; H05K 2201/0338; H05K 2201/1003
See application file for complete search history.

(56) References Cited

U.S. PATENT DOCUMENTS

| | | | |
|---|---|---|---|
| 2014/0209926 A1 | 7/2014 | Takatani et al. | |
| 2016/0093570 A1* | 3/2016 | Watanabe | ............. H01L 23/645 |
| | | | 257/531 |
| 2019/0057942 A1 | 2/2019 | Male et al. | |

* cited by examiner

PF1
FDP (MAU)
ML1
SUB1
SCP,SCP1
CL1b (MAU)
CL1a (MAU)
FDP (MAU)

SCP,SCP1,ML1

REP

REP

SCP,SCP1,ML1

REP

REP

SEMICONDUCTOR DEVICE

CROSS-REFERENCE TO RELATED APPLICATIONS

The disclosure of Japanese Patent Application No. 2021-143219 filed on Sep. 2, 2021 including the specification, drawings and abstract is incorporated herein by reference in its entirety.

BACKGROUND

The present invention relates to a semiconductor device, and can be suitably applied to, for example, a semiconductor device having a digital isolator.

In recent years, in the field of automobiles, the conversion of power source from gasoline engines to motors has been attempted in order to protect the environment. The rotation speed of the motor is controlled by a power semiconductor device equipped with a power semiconductor element for electric power. The power semiconductor device is controlled by a semiconductor device provided with a microcomputer.

A semiconductor device equipped with a power semiconductor element for electric power handles a voltage of about several hundred volts (V) to one thousand and several hundred volts (V). On the other hand, a semiconductor device equipped with a microcomputer is driven by a voltage of about several volts (V). For the control of the semiconductor device equipped with the power semiconductor element for electric power by the microcomputer, a digital isolator is applied in order to transmit and receive an electric signal between a circuit including the power semiconductor element and a circuit including the microcomputer.

In the digital isolator, an electric signal is transmitted by using the electromagnetic induction between an inductor (one inductor) electrically connected to the circuit including the power semiconductor element and an inductor (the other inductor) electrically connected to the circuit including the microcomputer.

There are disclosed techniques listed below.
[Patent Document 1] Japanese Unexamined Patent Application Publication No. 2016-127162

As a structure for transmitting the electric signal, for example, a structure (semiconductor device) in which one semiconductor chip in which one inductor is formed and the other semiconductor chip in which the other inductor is formed are joined is proposed in Patent Document 1. In this semiconductor device, the surface of one semiconductor chip and the surface of the other semiconductor chip are joined by a tape-shaped insulating material in the state where one inductor and the other inductor face each other.

SUMMARY

Further miniaturization has been required for the semiconductor device provided with a digital isolator.

Other objects and novel features will be apparent from the description of this specification and accompanying drawings.

A semiconductor device according to an embodiment has a first semiconductor chip and a second semiconductor chip, in which a first semiconductor circuit and a second semiconductor circuit are formed. The first semiconductor chip includes a first semiconductor substrate and a first multilayer wiring structure. The first semiconductor substrate has a first main surface. The first multilayer wiring structure is formed on the first semiconductor substrate so as to cover the first main surface, and a plurality of conductive films and a plurality of insulating films are stacked in the first multilayer wiring structure. The second semiconductor chip includes a second semiconductor substrate and a second multilayer wiring structure. The second semiconductor substrate has a second main surface. The second multilayer wiring structure is formed on the second semiconductor substrate so as to cover the second main surface. The second semiconductor circuit includes a first portion of the second semiconductor circuit and a second portion of the second semiconductor circuit. The first semiconductor circuit and the first portion of the second semiconductor circuit are formed in the first semiconductor chip. The second portion of the second semiconductor circuit electrically connected to the first portion of the second semiconductor circuit is formed in the second semiconductor chip. The first multilayer wiring structure includes a first inductor, a first electrode portion, and a second electrode portion. The first inductor is electrically connected to the first semiconductor circuit. The first electrode portion is electrically connected to the first semiconductor circuit. The second electrode portion is electrically connected to the first portion of the second semiconductor circuit. The second multilayer wiring structure includes a second inductor electrically connected to the second portion of the second semiconductor circuit. The first multilayer wiring structure and the second multilayer wiring structure are joined such that the first inductor and the second inductor are overlapped in plan view showing the first main surface of the first semiconductor substrate. The second semiconductor chip is joined to the first semiconductor chip such that the second semiconductor chip does not protrude from the first semiconductor chip and is not overlapped with the first electrode portion and the second electrode portion in plan view showing the first main surface of the first semiconductor substrate.

With the semiconductor device according to the embodiment described above, it is possible to contribute to further miniaturization of the semiconductor device.

BRIEF DESCRIPTION OF THE DRAWINGS

FIG. 8 is a cross-sectional view taken along the cross-sectional line VIII-VIII shown in FIG. 6 in the first embodiment.

FIG. 11 is a cross-sectional view taken along the cross-sectional line XI-XI shown in FIG. 9 in the first embodiment.

FIG. 14 is a cross-sectional view taken along the cross-sectional line XIV-XIV shown in FIG. 12 in the first embodiment.

FIG. 16 is a second cross-sectional view in the step shown in FIG. 15 in the first embodiment.

FIG. 18 is a plan view showing an example of a structure of a semiconductor device according to the second embodiment.

FIG. 20 is a cross-sectional view taken along the cross-sectional line XX-XX shown in FIG. 18 in the second embodiment.

FIG. 22 is a cross-sectional view of the semiconductor device according to the first example taken along the cross-sectional line XXII-XXII shown in FIG. 21 in the third embodiment.

FIG. 23 is a cross-sectional view of the semiconductor device according to the first example taken along the cross-sectional line XXIII-XXIII shown in FIG. 21 in the third embodiment.

FIG. 24 is a cross-sectional view of the semiconductor device according to the second example taken along the cross-sectional line XXII-XXII shown in FIG. 21 in the third embodiment.

FIG. 25 is a cross-sectional view of the semiconductor device according to the second example taken along the cross-sectional line XXIII-XXIII shown in FIG. 21 in the third embodiment.

DETAILED DESCRIPTION

First, an example of a circuit of a semiconductor device provided with a digital isolator and an outline of a structure thereof according to each embodiment will be described.

Figure 1:
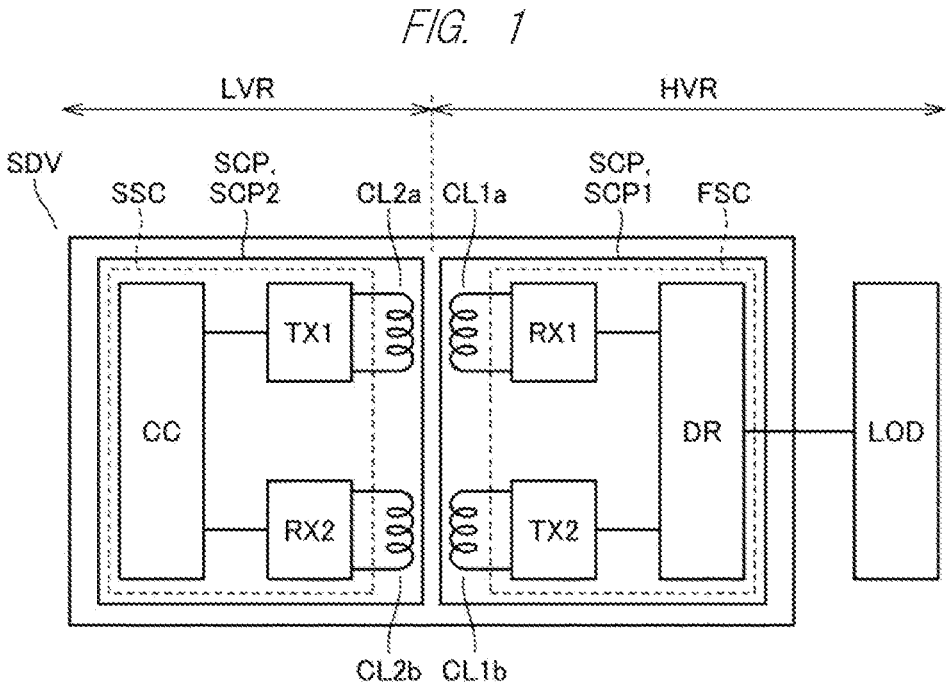
FIG. 1 is a circuit diagram showing an example of a circuit of a semiconductor device according to each embodiment.

As shown in FIG. 1, a semiconductor device SDV includes a first semiconductor chip SCP1 and a second semiconductor chip SCP2. A circuit FSC for the first semiconductor chip including a semiconductor element or the like for driving a load LOD such as a motor is formed in the first semiconductor chip SCP1. A circuit SSC for the second semiconductor chip including a semiconductor element or the like for driving a load LOD is formed in the second semiconductor chip SCP2. As will be described later, a part of the circuit SSC for the second semiconductor chip is formed in the first semiconductor chip SCP1.

The circuit FSC for the first semiconductor chip includes a drive circuit DR, a receiver circuit RX1, and a transmission circuit TX1. The drive circuit DR is electrically connected to the load LOD. The receiver circuit RX1 and the transmission circuit TX1 are electrically connected to the drive circuit DR. A coil CL1a is electrically connected to the receiver circuit RX1. A coil CL1b is electrically connected to the transmission circuit TX1. The circuit FSC for the first semiconductor chip operates (drives) at about several hundred volts (V) to one thousand and several hundred volts (V). The circuit FSC for the first semiconductor chip is formed in a high voltage region HVR in the semiconductor device SDV.

The circuit SSC for the second semiconductor chip includes a control circuit CC, a receiver circuit RX2, and a transmission circuit TX2. The receiver circuit RX2 and the transmission circuit TX2 are electrically connected to the control circuit CC. A coil CL2a is electrically connected to the transmission circuit TX2. A coil CL2b is electrically connected to the receiver circuit RX2. The circuit SSC for the second semiconductor chip operates (drives) at about several volts (V). The circuit SSC for the second semiconductor chip is formed in a low voltage region LVR in the semiconductor device SDV.

The coil CL1a and the coil CL2a are arranged so as to face each other. The coil CL1a and the coil CL2a are magnetically coupled to each other. The coil CL1b and the coil CL2b are arranged so as to face each other. The coil CL1b and the coil CL2b are magnetically coupled to each other.

A signal is transmitted from the control circuit CC to the transmission circuit TX1. The signal transmitted to the transmission circuit TX1 flows through the coil CL2a as a current. When a current flows through the coil CL2a, an induced current flows through the coil CL1a by electromagnetic induction. The induced current flowing through the coil CL1a is transmitted as a signal to the drive circuit DR via the receiver circuit RX1. In this way, the signal of the control circuit CC is transmitted to the drive circuit DRC.

On the other hand, a signal is transmitted from the drive circuit DR to the transmission circuit TX2. The signal transmitted to the transmission circuit TX2 flows through the coil CL1b as a current. When a current flows through the coil CL1b, an induced current flows through the coil CL2b by electromagnetic induction. The induced current flowing through the coil CL2b is transmitted as a signal to the control circuit CC via the receiver circuit RX2. In this way, the signal of the drive circuit DR is transmitted to the control circuit CC. By the series of operations above, the drive of the load LOD is controlled.

Figure 2:
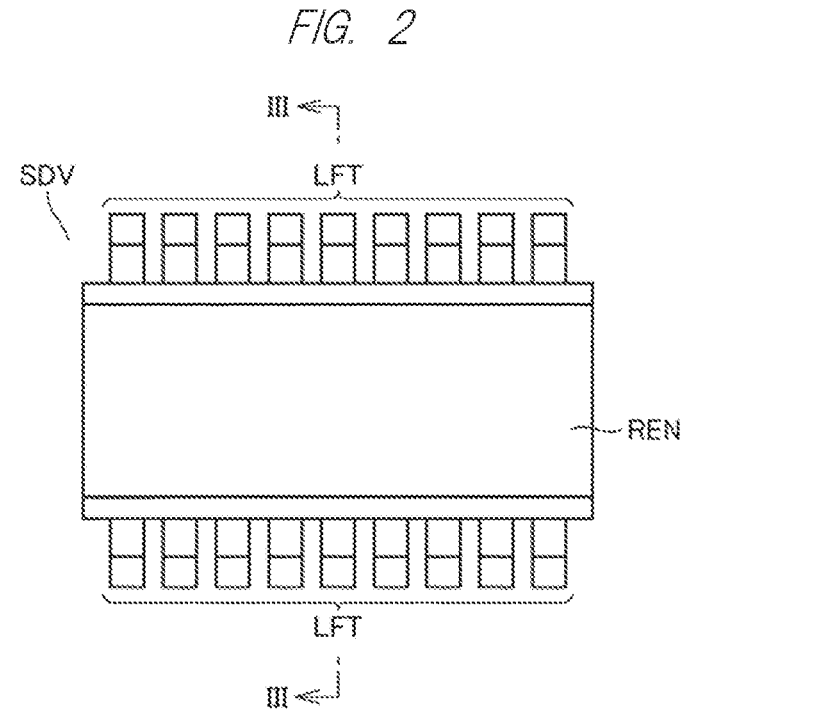
FIG. 2 is a plan view showing an example of an external appearance of the semiconductor device according to each embodiment.
Figure 3:
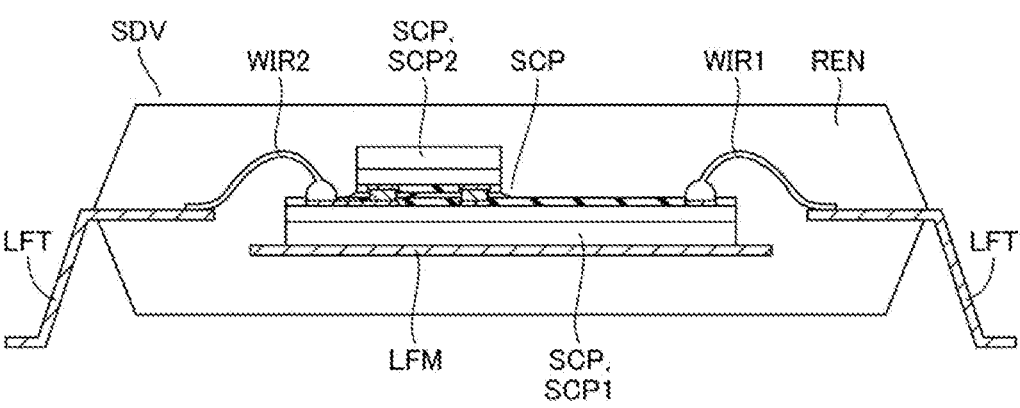
FIG. 3 is a cross-sectional view taken along the cross-sectional line III-III shown in FIG. 2 in each embodiment.

Next, an example of an overall structure of the semiconductor device SDV will be described. As shown in FIG. 2 and FIG. 3, in the semiconductor device SDV, a semiconductor chip SCP is mounted on a lead frame LFM. The semiconductor chip SCP mounted on the lead frame LFM is sealed by sealing resin REN. Lead terminals LFT are exposed from the sealing resin REN. As the sealing resin REN, for example, an epoxy resin is used.

The semiconductor chip SCP includes the first semiconductor chip SCP1 and the second semiconductor chip SCP2. The second semiconductor chip SCP2 is connected (bonded) on the first semiconductor chip SCP1. The first semiconductor chip SCP1 and the second semiconductor chip SCP2 are electrically connected by flip-chip connection. The first semiconductor chip SCP1 and the lead terminal LFT (lead frame LFM) are electrically connected by a wire WIR1 and a wire WIR2. Hereinafter, the structure of the semiconductor device SDV will be described more specifically.

First Embodiment

An example of the semiconductor device according to the first embodiment will be described. As described above, the semiconductor device SDV includes the first semiconductor chip SCP1 and the second semiconductor chip SCP2 as the semiconductor chip SCP. The circuit FSC for the first semiconductor chip (first semiconductor circuit) and the circuit SSC for the second semiconductor chip (second semiconductor circuit) are formed in the semiconductor device SDV. The circuit SSC for the second semiconductor chip includes a first circuit portion SSC1 for the second semiconductor chip (first portion of second semiconductor circuit) and a second circuit portion SSC2 for the second semiconductor chip (second portion of second semiconductor circuit).

Figure 4:
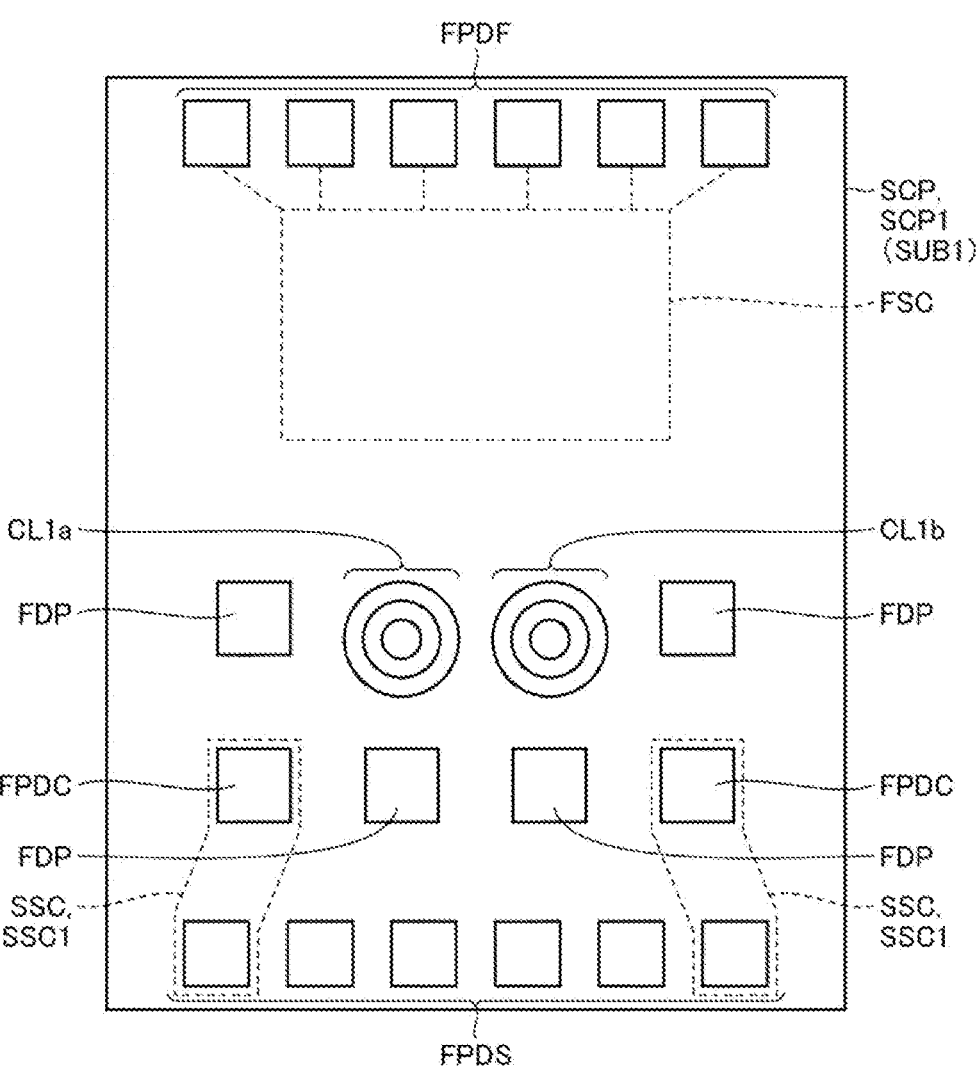
FIG. 4 is a plan view showing an example of a structure of a first semiconductor chip in the semiconductor device according to the first embodiment.

First, the first semiconductor chip SCP1 will be described. As shown in FIG. 4, the circuit FSC for the first semiconductor chip that drives the load LOD such as a motor is formed in the first semiconductor chip SCP1. Further, the first circuit portion SSC1 for the second semiconductor chip of the circuit SSC for the second semiconductor chip is formed in the first semiconductor chip SCP1.

A pad FPDF (first electrode portion) for the first semiconductor chip is arranged on a first main surface side of the first semiconductor substrate SUB1 in the first semiconductor chip SCP1. The pad FPDF for the first semiconductor chip is electrically connected to the circuit FSC for the first semiconductor chip. The pad FPDF for the first semiconductor chip is electrically connected to the lead frame LFM by the wire WIR1 (see FIG. 3).

Further, the coil CL1$a$ and the coil CL1$b$ (first inductor) are arranged on the first main surface side of the first semiconductor substrate SUB1. The coil CL1$a$ and the coil CL1$b$ are electrically connected to the circuit FSC for the first semiconductor chip. The coil CL1$a$ and the coil CL1$b$ face the coil CL2$a$ and the coil CL2$b$ (see FIG. 5) in the second semiconductor chip SCP2.

Further, a pad FPDS (second electrode portion) for the second semiconductor chip and a pad FPDC (third electrode portion) for connecting the second semiconductor chip to be electrically connected to the second semiconductor chip SCP2 are arranged on the first main surface side of the first semiconductor substrate SUB1. The pad FPDS for the second semiconductor chip functions as a silicon interposer of the second semiconductor chip SCP2. The pad FPDS for the second semiconductor chip is electrically connected to the lead frame LFM by the wire WIR2. The pad FPDS for the second semiconductor chip is arranged in a region outside the region where the second semiconductor chip SCP2 is arranged, on the first main surface side of the first semiconductor substrate SUB1.

The first circuit portion SSC1 for the second semiconductor chip includes an uppermost conductive film MAU (see FIG. 7) that electrically connects the pad FPDS for the second semiconductor chip and the pad FPDC for connecting the second semiconductor chip. The pad FPDC for connecting the second semiconductor chip is arranged in a region in which the second semiconductor chip SCP2 is arranged, on the first main surface side of the first semiconductor substrate SUB1. The pad FPDC for connecting the second semiconductor chip is to be electrically connected to a pad SPDC for connecting the first semiconductor chip (see FIG. 5) in the second semiconductor chip SCP2.

Further, a plurality of dummy pads FDP are arranged on the first main surface side of the first semiconductor substrate SUB1. The plurality of dummy pads FDP are arranged in the region to which the second semiconductor chip SCP2 is joined. The plurality of dummy pads FDP include at least three dummy pads FDP that are not arranged in a straight line.

Figure 5:
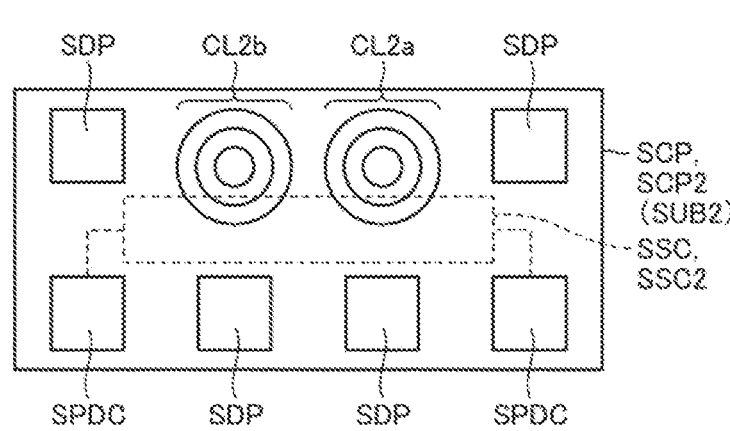
FIG. 5 is a plan view showing an example of a structure of a second semiconductor chip in the semiconductor device in the first embodiment.

Next, the second semiconductor chip SCP2 will be described. As shown in FIG. 5, the second circuit portion SSC2 for the second semiconductor chip of the circuit SSC for the second semiconductor chip is formed in the second semiconductor chip SCP2. The second circuit portion SSC2 for the second semiconductor chip substantially controls the drive of the load LOD.

The pad SPDC (fourth electrode portion) for connecting the first semiconductor chip is arranged on the second main surface side of the second semiconductor substrate SUB2 in the second semiconductor chip SCP2. The pad SPDC for connecting the first semiconductor chip is to be electrically connected to the pad FPDC for connecting the second semiconductor chip in the first semiconductor chip SCP1.

Also, the coil CL2$a$ and the coil CL2$b$ (second inductor) are arranged on the second main surface side of the second semiconductor substrate SUB2 in the second semiconductor chip SCP2. The coil CL2$a$ and the coil CL2$b$ are electrically connected to the second circuit portion SSC2 for the second semiconductor chip. The coil CL2$a$ and the coil CL2$b$ face the coil CL1$a$ and the coil CL1$b$ (see FIG. 4) in the first semiconductor chip SCP1.

Further, a plurality of dummy pads SDP are arranged on the second main surface side of the second semiconductor substrate SUB2. The plurality of dummy pads SDP include at least three dummy pads SDP that are not arranged in a straight line. Each of the plurality of dummy pads SDP faces the corresponding dummy pad FDP of the plurality of dummy pads FDP formed in the first semiconductor chip SCP1.

Figure 6:
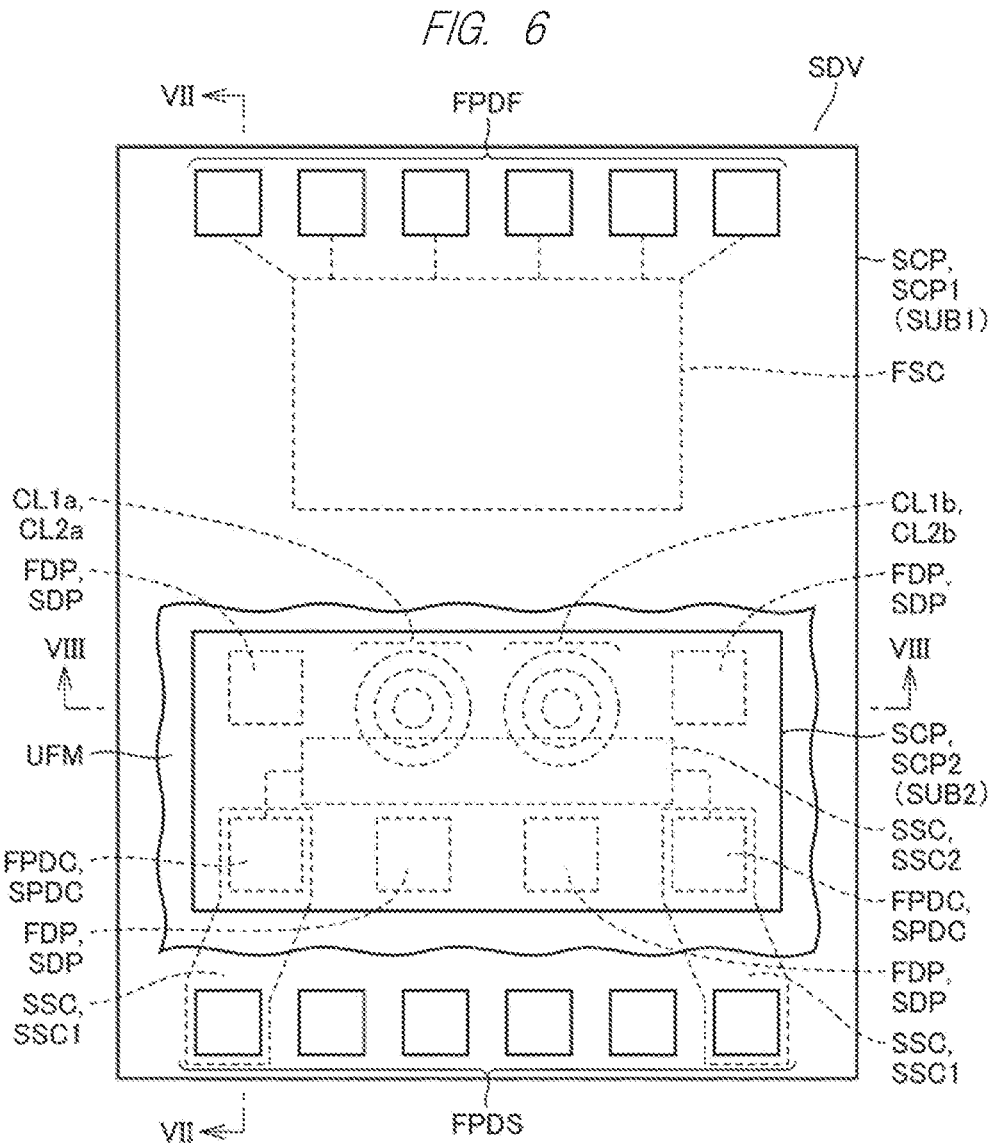
FIG. 6 is a plan view showing an example of a structure in the state where the second semiconductor chip is joined to the first semiconductor chip in the first embodiment.
Figure 7:
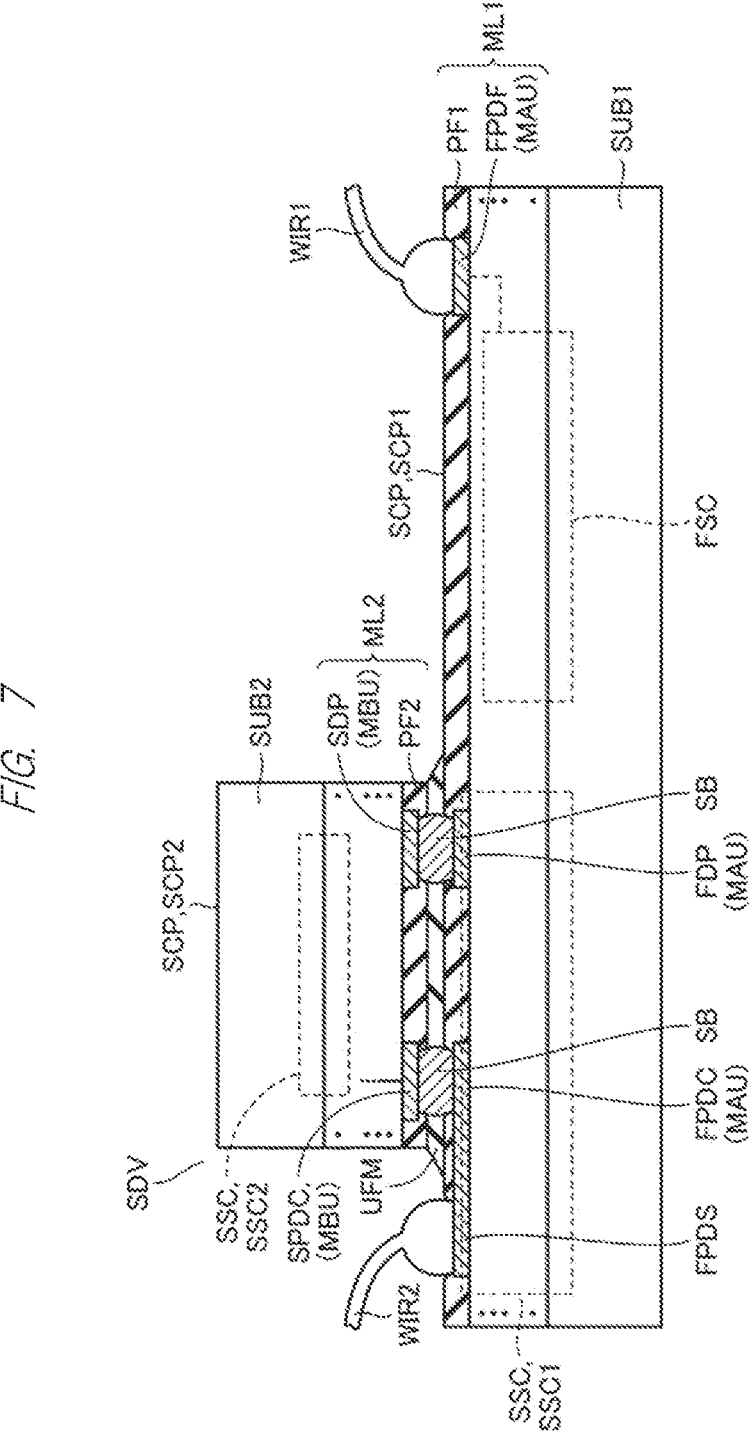
FIG. 7 is a cross-sectional view taken along the cross-sectional line VII-VII shown in FIG. 6 in the first embodiment.
Figure 8:
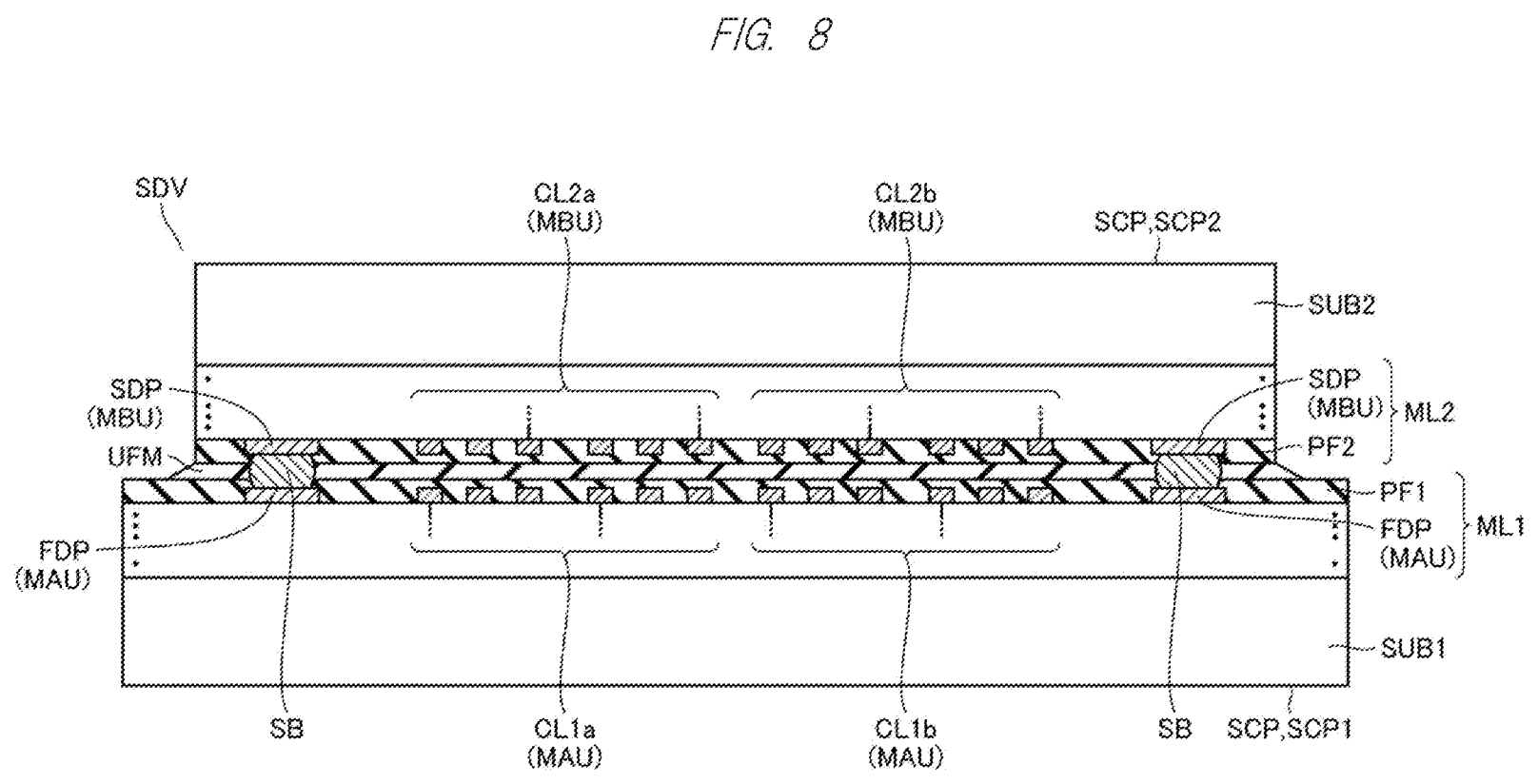

Next, the state in which the second semiconductor chip SCP2 is mounted on the first semiconductor chip SCP1 will be described. As shown in FIG. 6, FIG. 7, and FIG. 8, a first multilayer wiring structure ML1 is formed in the first semiconductor chip SCP1 so as to cover the first main surface of the first semiconductor substrate SUB1. A plurality of conductive films and a plurality of insulating films are stacked in the first multilayer wiring structure ML1. A second multilayer wiring structure ML2 is formed in the second semiconductor chip SCP2 so as to cover the second main surface of the second semiconductor substrate SUB2.

In the semiconductor device SDV, the first multilayer wiring structure ML1 in the first semiconductor chip SCP1 and the second multilayer wiring structure ML2 in the second semiconductor chip SCP2 are joined such that the coil CL1$a$ and the coil CL2$a$ are overlapped and the coil CL1$b$ and the coil CL2$b$ are overlapped in plan view showing the first main surface of the first semiconductor substrate SUB1. Note that the plan view showing the first main surface means a plan view of the first main surface seen from a direction perpendicular to the first main surface.

Also, in plan view showing the first main surface of the first semiconductor substrate SUB1, the second semiconductor chip SCP2 is joined to the first semiconductor chip SCP1 such that it does not protrude from the first semiconductor chip SCP1. Namely, the second semiconductor chip SCP2 is joined to the first semiconductor chip SCP1 so as not to have an offset structure with respect to the first semiconductor chip SCP1.

Further, in plan view showing the first main surface of the first semiconductor substrate SUB1, the second semiconductor chip SCP2 is joined to the first semiconductor chip SCP1 such that it does not overlap the pad FPDF for the first semiconductor chip and the pad FPDS for the second semiconductor chip. Namely, the pad FPDF for the first semiconductor chip and the pad FPDS for the second semiconductor chip are arranged in a region other than the region to which the second semiconductor chip SCP2 is joined, in the first semiconductor chip SCP1.

In the first multilayer wiring structure ML1 in the first semiconductor chip SCP1, a plurality of conductive films and a plurality of insulating films are stacked. As the conductive film, for example, an aluminum film is applied. Note that the aluminum film includes an aluminum alloy film. Of the plurality of conductive films, the uppermost conductive film MAU located in the uppermost layer farthest from the first main surface of the first semiconductor substrate SUB1 may be formed more thickly than the other conductive films (not shown).

The uppermost conductive film MAU includes the pad FPDF for the first semiconductor chip, the pad FPDS for the second semiconductor chip, the coil CL1$a$, the coil CL1$b$, the pad FPDC for connecting the second semiconductor chip, and the dummy pad FDP. An insulating film PF1 is formed so as to cover the coil CL1$a$, the coil CL1$b$, and the like. Note that the coil CL1$a$ and the coil CL1$b$ may be formed by a conductive film in a layer lower than the uppermost conductive film MAU.

In the second multilayer wiring structure ML2 in the second semiconductor chip SCP2, a plurality of conductive films and a plurality of insulating films are stacked. As the conductive film, for example, an aluminum film is applied. Note that the aluminum film includes an aluminum alloy film. Of the plurality of conductive films, the uppermost conductive film MBU located in the uppermost layer farthest from the second main surface of the second semiconductor substrate SUB2 may be formed more thickly than the other conductive films (not shown).

The uppermost conductive film MBU includes the pad SPDC for connecting the first semiconductor chip, the coil CL2$a$, the coil CL2$b$, and the dummy pad SDP. An insulating film PF2 is formed so as to cover the coil CL2$a$, the coil CL2$b$, and the like. Note that the coil CL2$a$ and the coil CL2$b$ may be formed by a conductive film in a layer lower than the uppermost conductive film MBU.

The first semiconductor chip SCP1 (first multilayer wiring structure ML1) and the second semiconductor chip SCP2 (second multilayer wiring structure ML2) are joined to each other by, for example, the flip-chip connection using solder bumps SB. The pad FPDC for connecting the second semiconductor chip in the first semiconductor chip SCP1 and the pad SPDC for connecting the first semiconductor chip in the second semiconductor chip SCP2 face each other. The solder bump SB (first conductive member) is interposed between the pad FPDC for connecting the second semiconductor chip and the pad SPDC for connecting the first semiconductor chip.

The dummy pad FDP in the first semiconductor chip SCP1 and the dummy pad SDP in the second semiconductor chip SCP2 face each other. The solder bump SB (second conductive member) is interposed between the dummy pad FDP and the dummy pad SDP. An insulating material UFM as an underfill material is filled between the first semiconductor chip SCP1 and the second semiconductor chip SCP2. The semiconductor device SDV according to the first embodiment is configured as described above.

Figure 9:
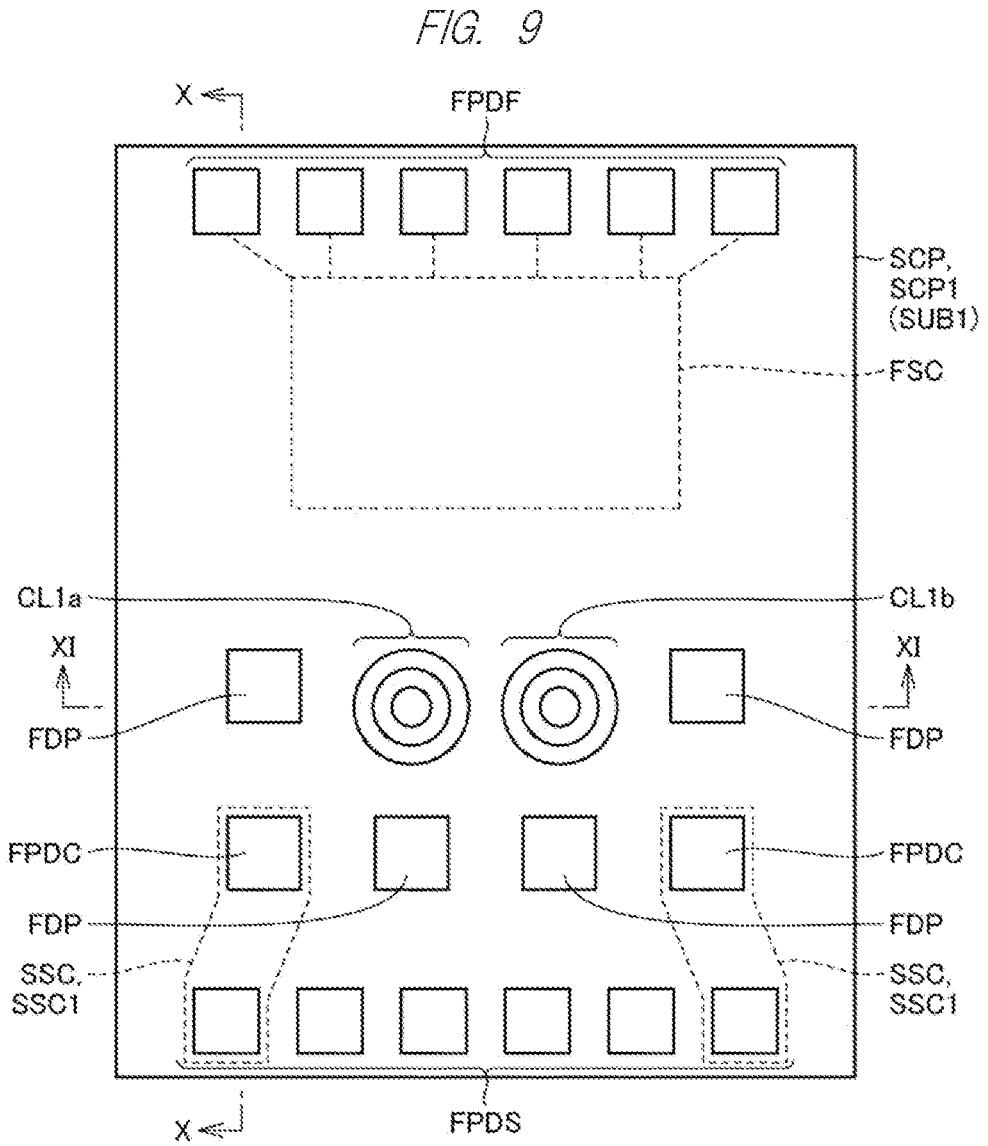
FIG. 9 is a plan view showing a step of a method of manufacturing the first semiconductor chip in a method of manufacturing the semiconductor device in the first embodiment.
Figure 10:
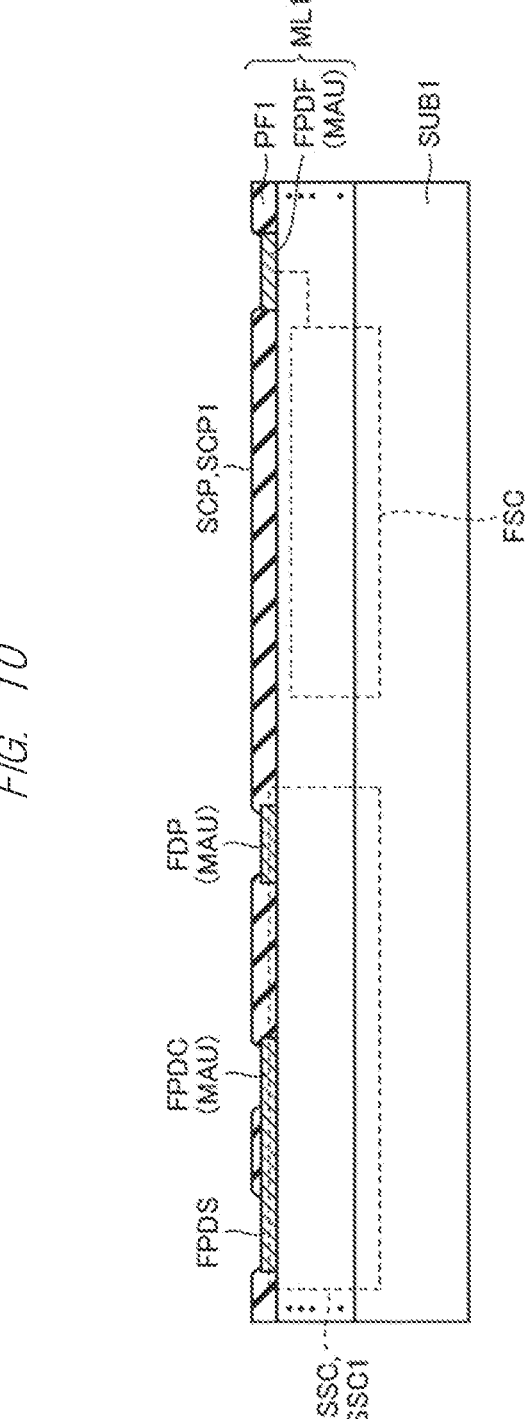
FIG. 10 is a cross-sectional view taken along the cross-sectional line X-X shown in FIG. 9 in the first embodiment.
Figure 11:
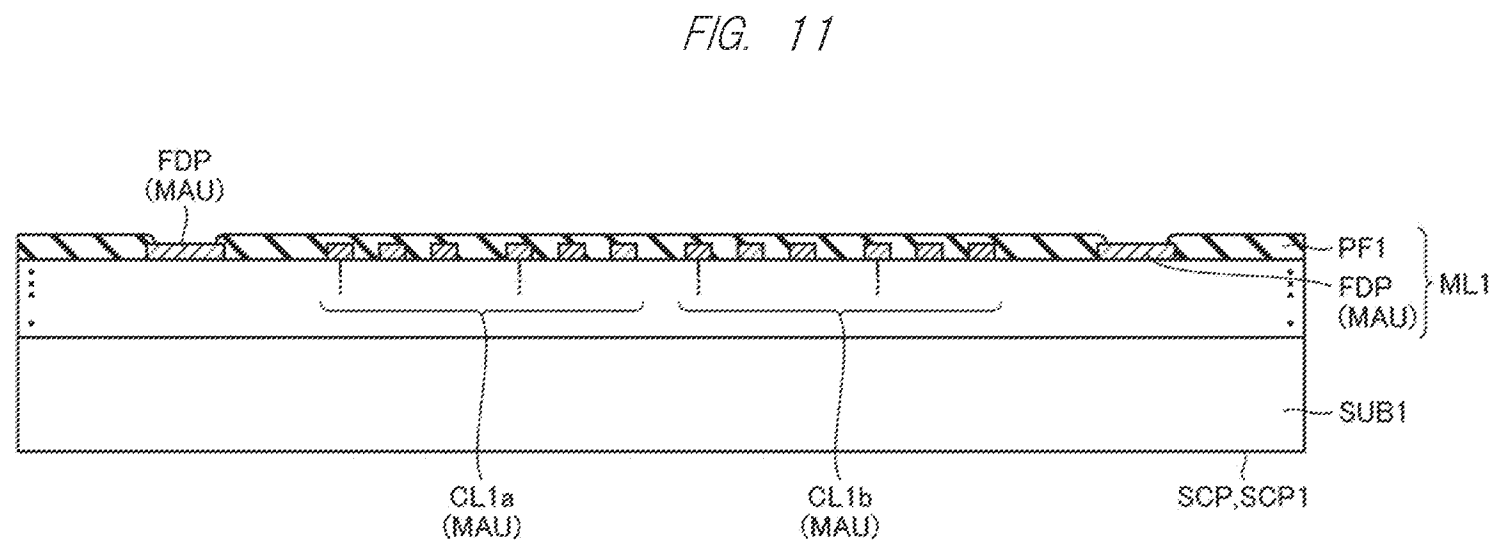

Next, an example of the method of manufacturing the above-mentioned semiconductor device SDV will be described. First, the first semiconductor chip SCP1 and the second semiconductor chip SCP2 are formed, respectively. As shown in FIG. 9, FIG. 10, and FIG. 11, in the first semiconductor chip SCP1, a desired semiconductor element constituting the circuit FSC for the first semiconductor chip is formed on the first main surface of the first semiconductor substrate SUB1. The first multilayer wiring structure ML1 including a conductive film (wiring or the like) electrically connected to the semiconductor element is formed so as to cover the first main surface of the first semiconductor substrate SUB1.

The uppermost conductive film MAU formed in the uppermost layer of the first multilayer wiring structure ML1 includes the pad FPDF for the first semiconductor chip, the pad FPDS for the second semiconductor chip, the coil CL1$a$, the coil CL1$b$, the pad FPDC for connecting the second semiconductor chip, and the dummy pad FDP.

The insulating film PF1 is formed so as to cover the coil CL1$a$, the coil CL1$b$, and the like. By performing predetermined photolithography process and etching process to the insulating film PF1, the pad FPDF for the first semiconductor chip, the pad FPDS for the second semiconductor chip, the pad FPDC for connecting the second semiconductor chip, and the dummy pad FDP are exposed. In this way, the first semiconductor chip SCP1 is formed.

Figure 12:
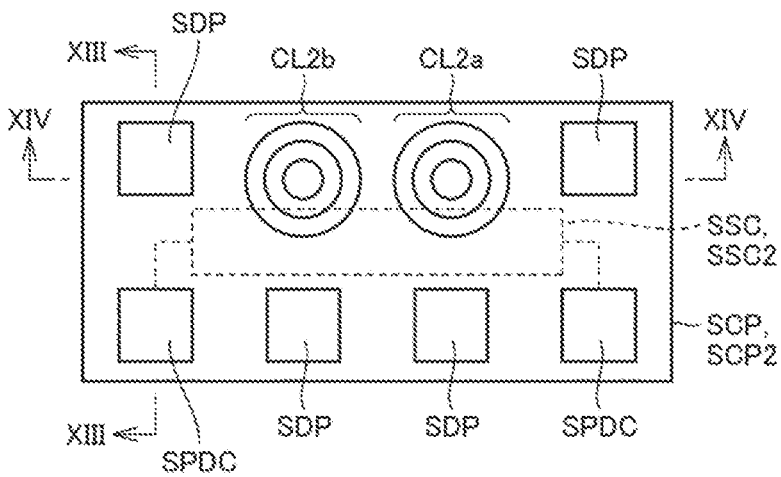
FIG. 12 is a plan view showing a step of a method of manufacturing the second semiconductor chip in the method of manufacturing the semiconductor device in the first embodiment.
Figure 13:
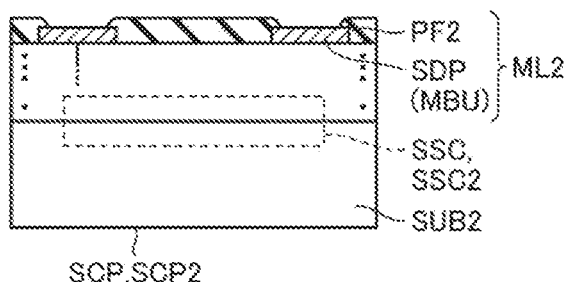
FIG. 13 is a cross-sectional view taken along the cross-sectional line XIII-XIII shown in FIG. 12 in the first embodiment.
Figure 14:
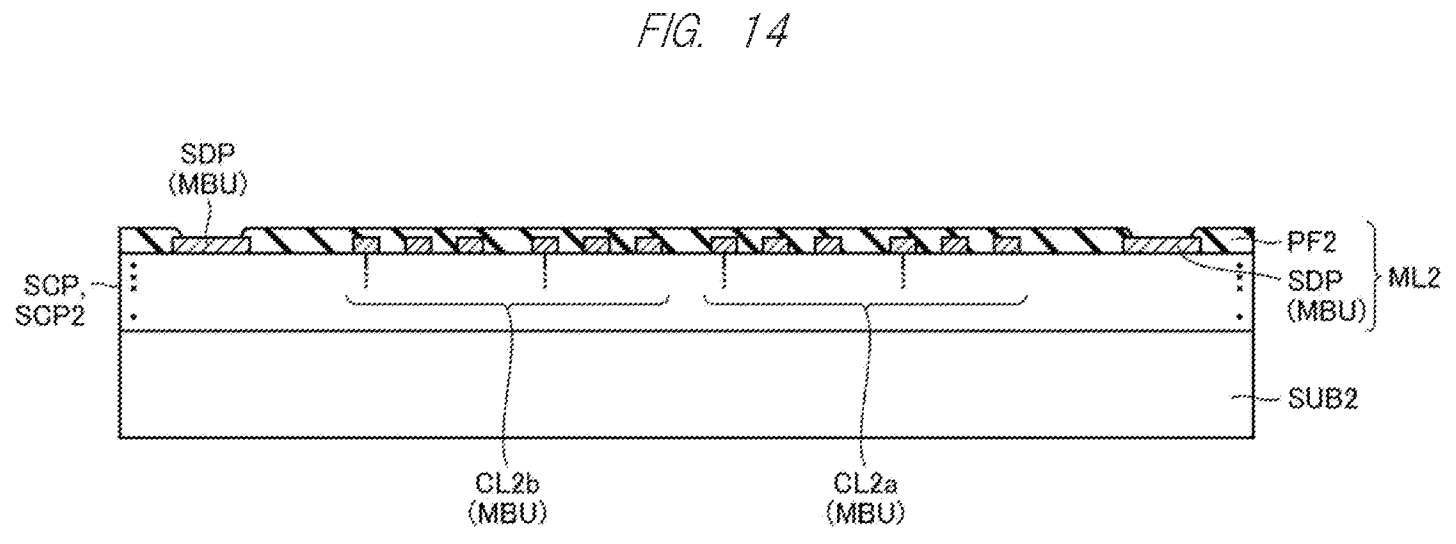

As shown in FIG. 12, FIG. 13, and FIG. 14, in the second semiconductor chip SCP2, a desired semiconductor element constituting the circuit SSC for the second semiconductor chip is formed on the second main surface of the second semiconductor substrate SUB2. The second multilayer wiring structure ML2 including a conductive film (wiring or the like) electrically connected to the semiconductor element is formed so as to cover the second main surface of the second semiconductor substrate SUB2.

The uppermost conductive film MBU formed in the uppermost layer of the second multilayer wiring structure ML2 includes the pad SPDC for connecting the first semiconductor chip, the coil CL2$a$, the coil CL2$b$, and the dummy pad SDP.

The insulating film PF2 is formed so as to cover the coil CL2$a$, the coil CL2$b$, and the like. By performing predetermined photolithography process and etching process to the insulating film PF2, the pad SPDC for connecting the first semiconductor chip and the dummy pad SDP are exposed. In this way, the second semiconductor chip SCP2 is formed.

Figure 15:
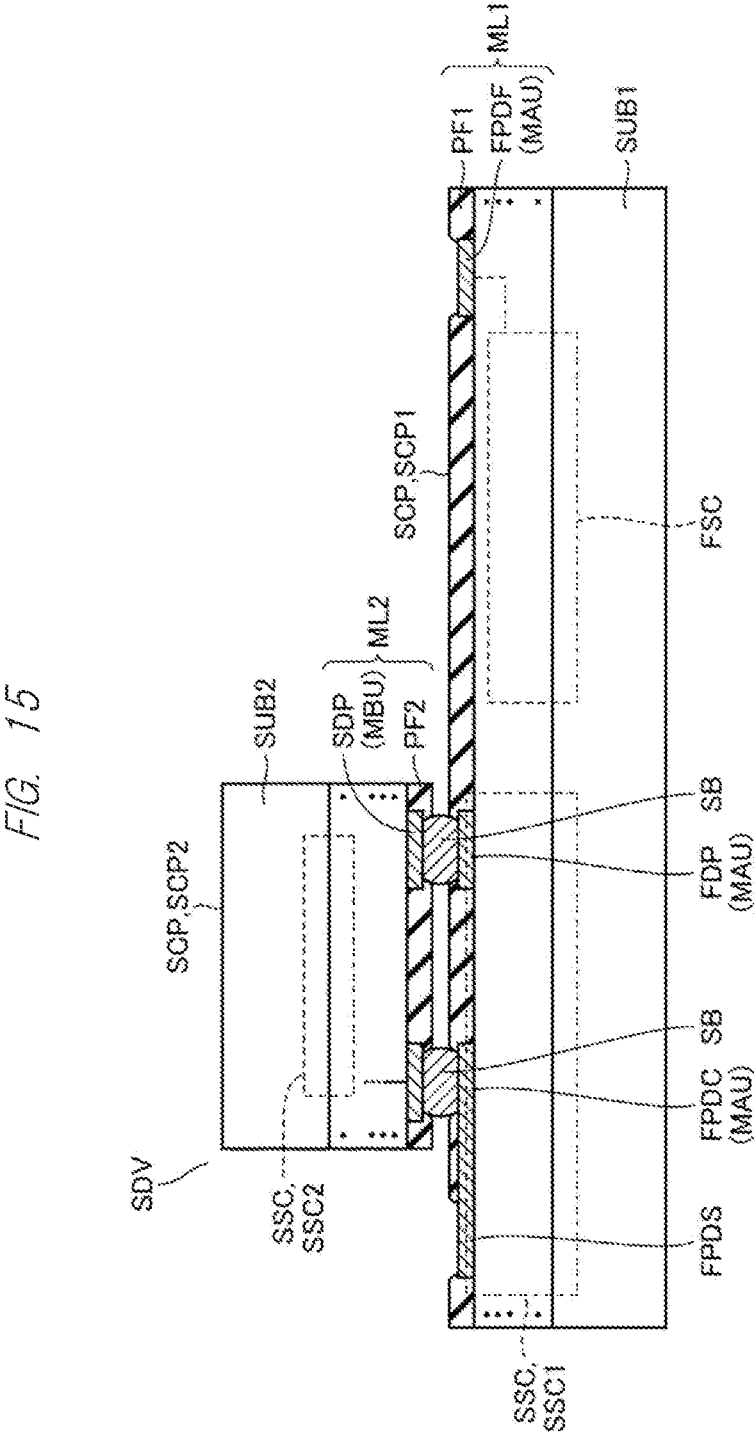
FIG. 15 is a first cross-sectional view showing a step performed after the steps shown in FIG. 9 and FIG. 12 in the first embodiment.
Figure 16:
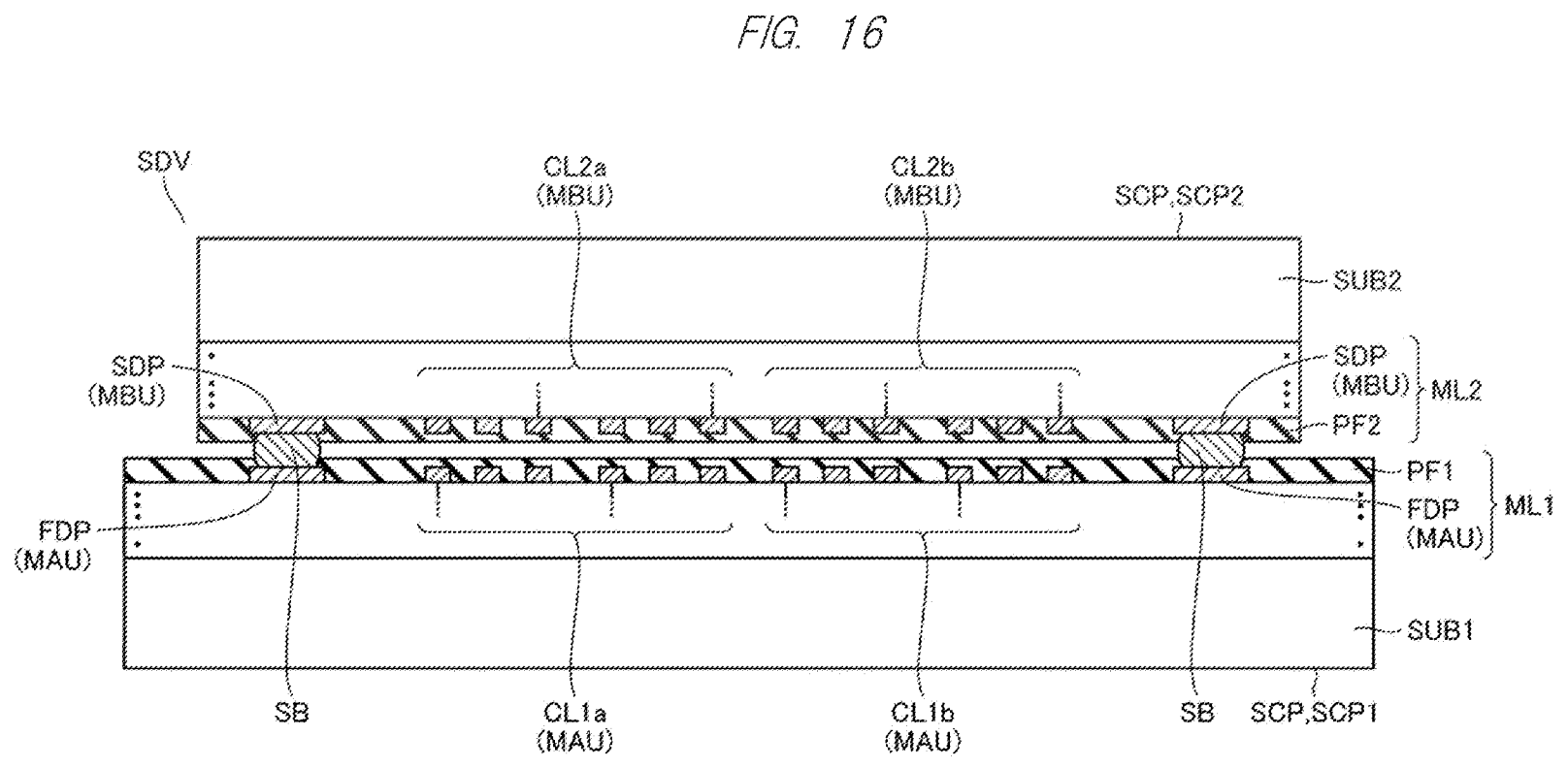

Next, as shown in FIG. 15 and FIG. 16, the second semiconductor chip SCP2 is joined to the first semiconductor chip SCP1 by flip-chip connection. By inverting the second semiconductor chip SCP2, the second semiconductor chip SCP2 is joined to the first semiconductor chip SCP1 such that the second main surface side (second multilayer wiring structure ML2) of the second semiconductor chip SCP2 faces the first main surface side (first multilayer wiring structure ML1) of the first semiconductor chip SCP1. Here, for example, the solder bump SB is applied.

The pad FPDC for connecting the second semiconductor chip in the first semiconductor chip SCP1 and the pad SPCD for connecting the first semiconductor chip in the second semiconductor chip SCP2 are joined by the solder bump SB. The dummy pad FDP in the first semiconductor chip SCP1 and the dummy pad SDP in the second semiconductor chip SCP2 are joined by the solder bump SB.

At this time, since the solder bump SB is melted in the reflow, the positions of the first semiconductor chip SCP1 and the second semiconductor chip SCP2 can be self-aligned by the surface tension of the solder bump SB. Further, at least three dummy pads FDP that are not arranged in a straight line are formed in the first semiconductor chip SCP1. At least three dummy pads SDP that are not arranged in a straight line and correspond to the dummy pads FDP are formed in the second semiconductor chip SCP2. Thus, by interposing the solder bump SB, the distance (interval) between the first semiconductor chip SCP1 and the second semiconductor chip SCP2 can be maintained at a substantially constant distance (interval) corresponding to the size of the solder bump SB.

Next, the insulating material UFM as an underfill material is filled between the first semiconductor chip SCP1 and the second semiconductor chip SCP2 (see FIG. 7 and FIG. 8). The first semiconductor chip SCP1 and the second semiconductor chip SCP2 are mounted on the lead frame LFM (see FIG. 3). Next, the pad FPDF for the first semiconductor chip in the first semiconductor chip SCP1 and the corresponding lead frame LFM are electrically connected by the wire WIR1 by wire bonding. Further, the pad FPDS for the second semiconductor chip in the first semiconductor chip SCP1 and the corresponding lead frame LFM are electrically connected by the wire WIR2 by wire bonding.

Next, the first semiconductor chip SCP1 and the second semiconductor chip SCP2 mounted on the lead frame LFM are arranged in a mold (not shown). By filling the mold with the sealing resin REN such as epoxy resin, the first semiconductor chip SCP1 and the second semiconductor chip SCP2 are sealed in the sealing resin REN. Next, the first semiconductor chip SCP1 and the second semiconductor chip SCP2 sealed in the sealing resin REN are taken out from the mold. Thereafter, the lead frame RFM protruding from the sealing resin REN is subjected to a desired bending process or the like to form the lead terminal LFT, whereby the semiconductor device SDV shown in FIG. 1 and FIG. 2 is completed.

Next, the effect of the above-mentioned semiconductor device SDV will be described in comparison with the semiconductor device according to the comparative example.

Figure 17:
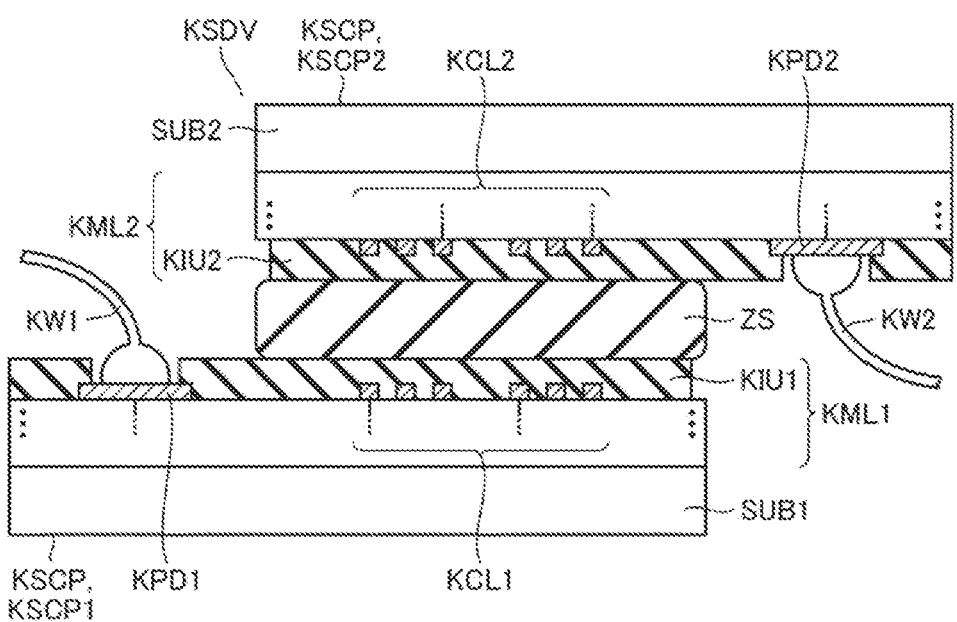
FIG. 17 is a cross-sectional view of a semiconductor device according to a comparative example.

As shown in FIG. 17, a semiconductor device KSDV according to the comparative example includes a first semiconductor chip KSCP1 and a second semiconductor chip KSCP2 as semiconductor chip KSCP. The first semiconductor chip KSCP1 corresponds to the first semiconductor chip SCP1 shown in FIG. 1. The second semiconductor chip KSCP2 corresponds to the second semiconductor chip SCP2 shown in FIG. 1.

A first multilayer wiring structure KML1 is formed so as to cover the first main surface of the first semiconductor substrate SUB1 of the first semiconductor chip KSCP1. The first multilayer wiring structure KML1 includes a coil KCL1, a pad KPD1 for the first semiconductor chip, and an insulating film KIU1. The insulating film KIU1 is formed so as to cover the coil KCL1 and expose the pad KPD1 for the first semiconductor chip. A wire KW1 is connected to the pad KPD1 for the first semiconductor chip.

A second multilayer wiring structure KML2 is formed so as to cover the second main surface of the second semiconductor substrate SUB2 of the second semiconductor chip KSCP2. The second multilayer wiring structure KML2 includes a coil KCL2, a pad KPD2 for the second semiconductor chip, and an insulating film KIU2. The insulating film KIU2 is formed so as to cover the coil KCL2 and expose the pad KPD2 for the second semiconductor chip. A wire KW2 is connected to the pad KPD2 for the second semiconductor chip.

The first semiconductor chip KSCP1 and the second semiconductor chip KSCP2 are joined by an insulating sheet ZS such that the coil KCL1 and the coil KCL2 face each other. Further, the second semiconductor chip KSCP2 is joined to the first semiconductor chip KSCP1 so as to protrude from the first semiconductor chip KSCP1 such that the wire KW2 can be connected to the pad KPD2 for the second semiconductor chip.

In other words, the second semiconductor chip KSCP2 is joined to the first semiconductor chip KSCP1 such that it protrudes from the first semiconductor chip KSCP1 in plan view showing the first main surface of the first semiconductor substrate SUB1. Namely, in the semiconductor device KSDV according to the comparative example, the second semiconductor chip KSCP2 is joined to the first semiconductor chip KSCP1 so as to have an offset structure.

As described above, in the semiconductor device KSDV according to the comparative example, the second semiconductor chip KSCP2 is joined to the first semiconductor chip KSCP1 so as to have an offset structure, and the second semiconductor chip KSCP2 protrudes from the first semiconductor chip KSCP1.

Therefore, the semiconductor device KSDV according to the comparative example has a restriction on further miniaturization because the second semiconductor chip KSCP2 protruding from the first semiconductor chip KSCP1 is sealed by the sealing resin.

Further, the first semiconductor chip KSCP1 and the second semiconductor chip KSCP2 are joined by the insulating sheet ZS serving as an adhesive. Therefore, when the coil KCL1 and the coil KCL2 are made to face each other such that they are overlapped in plan view, it becomes difficult to relatively align the first semiconductor chip KSCP1 and the second semiconductor chip KSCP2.

Further, in the semiconductor device KSDV according to the comparative example, it is necessary to reverse the vertical relationship between the first semiconductor chip KSCP1 and the second semiconductor chip KSCP2 when performing the wire bonding. Specifically, when the wire KW1 is connected to the pad KPD1 for the first semiconductor chip, the first semiconductor chip KSCP1 is located on the lower side. On the other hand, when the wire KW2 is connected to the pad KPD2 for the second semiconductor chip, the second semiconductor chip KSCP2 is located on the lower side. Therefore, the process of performing wire bonding becomes complicated.

In contrast to the semiconductor device KSDV according to the comparative example, in the semiconductor device SDV according to the first embodiment, the second semiconductor chip SCP2 is joined to the first semiconductor chip SCP1 such that it does not protrude from the first semiconductor chip SCP1. Namely, the second semiconductor chip SCP2 is joined to the first semiconductor chip SCP1 so as not to have an offset structure with respect to the first semiconductor chip SCP1.

Accordingly, the size of the sealing resin REN (see FIG. 3) in which the first semiconductor chip SCP1 and the second semiconductor chip SCP2 are sealed can be reduced by the amount that the second semiconductor chip SCP2 does not protrude from the first semiconductor chip SCP1. As a result, it is possible to contribute to further miniaturization of the semiconductor device SDV. According to the evaluation by the inventors, it was found that the size of the semiconductor device could be reduced by about 20% as compared with the semiconductor device having an offset structure.

Further, in the semiconductor device SDV according to the first embodiment, the first semiconductor chip SCP1 and the second semiconductor chip SCP2 are electrically joined by flip-chip connection. In particular, since the solder bump SB is applied for the flip-chip connection, the first semiconductor chip SCP1 and the second semiconductor chip SCP2 can be more easily aligned as compared with the case where the insulating sheet ZS is used. Namely, when the solder bump SB is used, surface tension is generated in the solder bump SB by melting the solder bump SB in the reflow. By the surface tension of the solder bump SB, the positions of the first semiconductor chip SCP1 and the second semiconductor chip SCP2 can be self-aligned.

Further, as the conductive member applied to the flip-chip connection, for example, a gold bump or a copper pillar can be applied in addition to the solder bump SB. By interposing such a conductive member between the first semiconductor chip SCP1 and the second semiconductor chip SCP2, the interval between the coil CL1$a$ and the coil CL2$a$ and the interval between the coil CL1$b$ and the coil CL2$b$ can be secured. As a result, the quality in communication and the withstand voltage between the first semiconductor chip SCP1 and the second semiconductor chip SCP2 can be improved more than those in the case of the semiconductor device according to the comparative example.

Further, in the semiconductor device SDV according to the first embodiment, the wire WIR1 to be electrically connected to the first semiconductor chip SCP1 and the wire WIR2 to be electrically connected to the second semiconductor chip SCP2 are bonded to the first semiconductor chip SCP1. Specifically, the wire WIR1 is bonded to the pad FPDF for the first semiconductor chip in the first semiconductor chip SCP1. The wire WIR2 is bonded to the pad FPDS for the second semiconductor chip in the first semiconductor chip SCP1.

Accordingly, in comparison to the case where the wire KW1 is connected to the first semiconductor chip KSCP1 and the wire KW2 is connected to the second semiconductor chip KSCP2, it becomes unnecessary to invert the first semiconductor chip SCP1 and the second semiconductor chip SCP2 connected by the flip-chip connection in the process of wire bonding. As a result, it is possible to simplify the process of the wire bonding and to contribute to the reduction in production cost.

In the semiconductor device SDV described above, an aluminum film is used as an example of the conductive film in the first multilayer wiring structure ML1 and the second multilayer wiring structure ML2. Alternatively, a conductive film made of another conductive material such as a copper film can also be applied as the conductive film in addition to the aluminum film.

Second Embodiment

As described above, the circuit FSC for the first semiconductor chip driven by a voltage of about several hundred volts (V) to one thousand and several hundred volts (V) and the circuit SSC for the second semiconductor chip driven by a voltage of about several volts (V) are formed in the semiconductor device SDV. The circuit SSC for the second semiconductor chip includes the first circuit portion SSC1 for the second semiconductor chip and the second circuit portion SSC2 for the second semiconductor chip.

The circuit FSC for the first semiconductor chip is formed in the first semiconductor chip SCP1. The first circuit portion SSC1 for the second semiconductor chip of the circuit SSC for the second semiconductor chip is formed in the first semiconductor chip SCP1. The second circuit portion SSC2 for the second semiconductor chip is formed in the second semiconductor chip SCP2.

Therefore, in the first semiconductor chip SCP1, the high voltage region HVR to which a voltage of about several hundred volts (V) to one thousand and several hundred volts (V) is applied (supplied) and the low voltage region LVR to which a voltage of several volts (V) is applied (supplied) are present next to each other. Thus, in the first semiconductor chip SCP1, it is conceivable that the noise (common mode noise) caused by the current flowing in the high voltage region HVR affects the current flowing in the low voltage region LVR. In the second embodiment, an example of a semiconductor device configured to block such noise propagation will be described.

Figure 18:
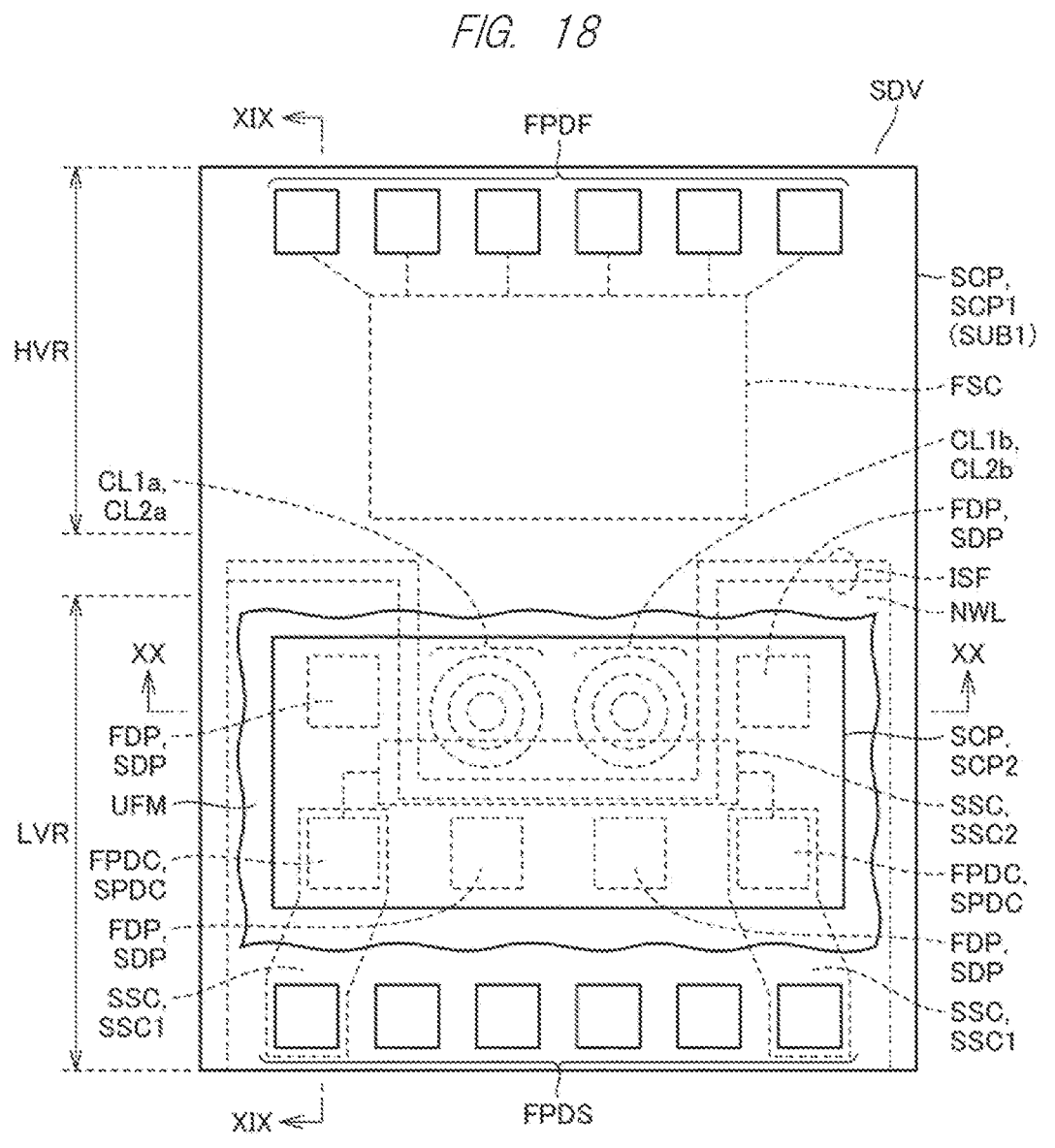
Figure 19:
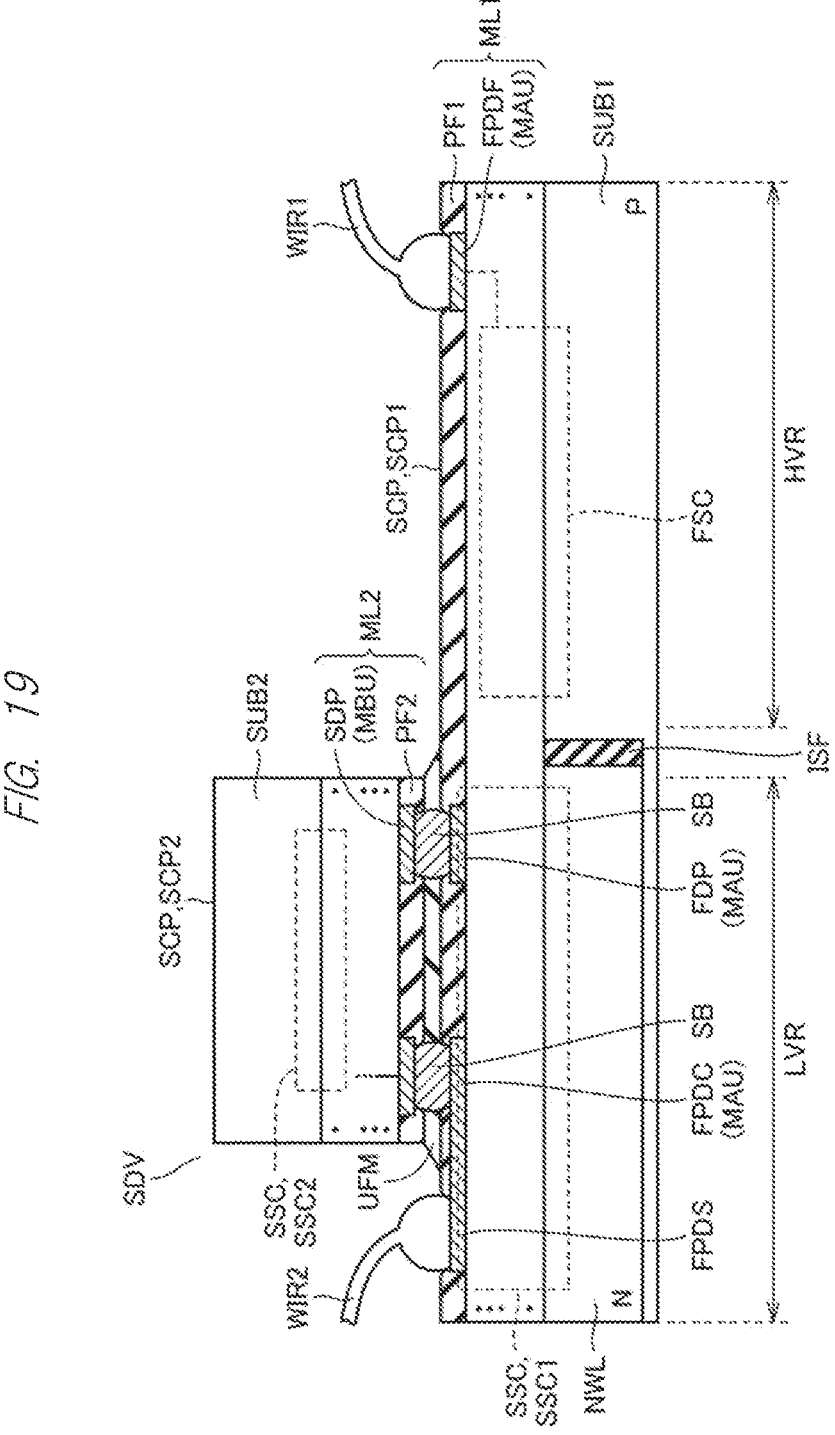
FIG. 19 is a cross-sectional view taken along the cross-sectional line XIX-XIX shown in FIG. 18 in the second embodiment.
Figure 20:
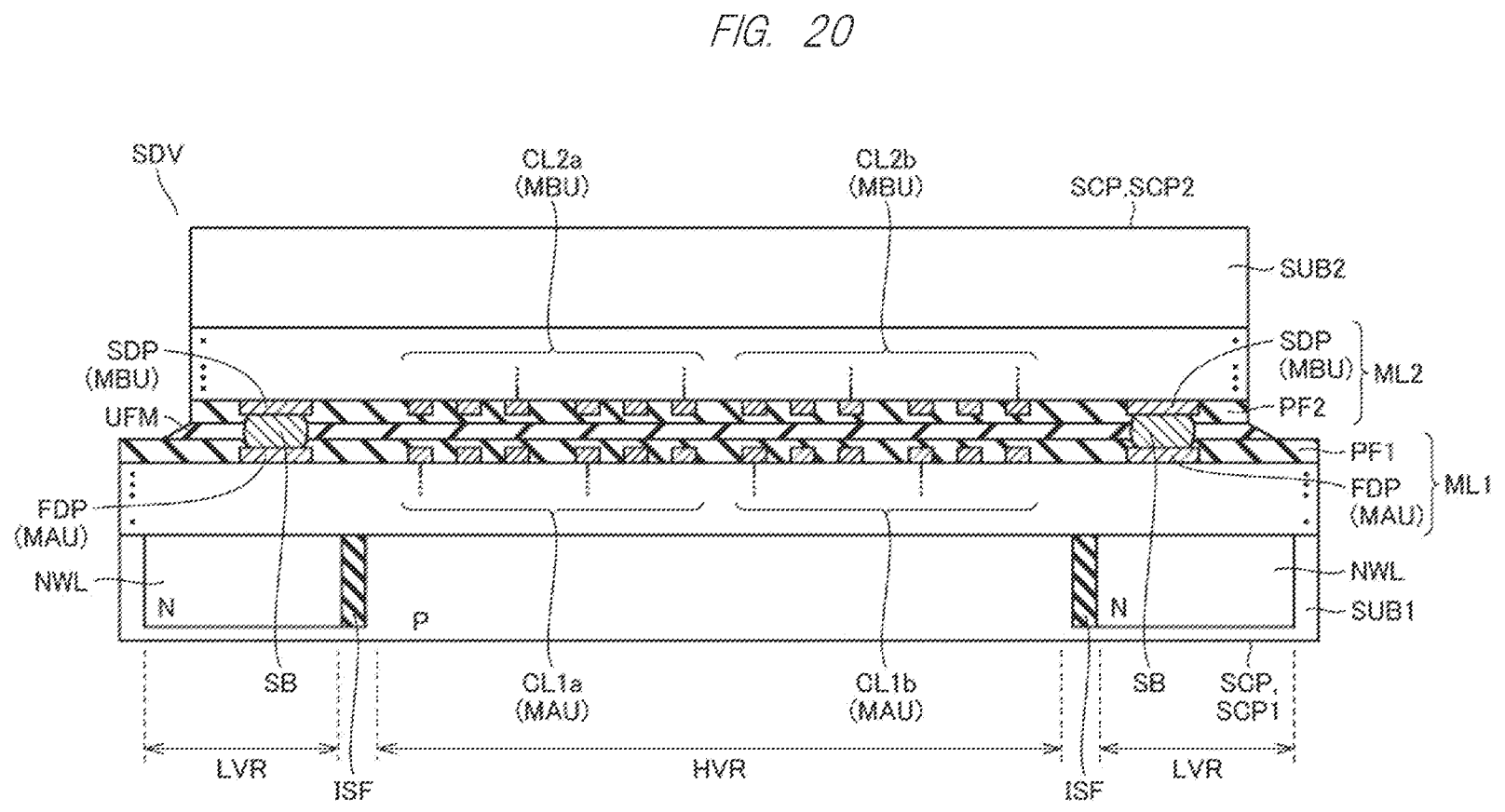

As shown in FIG. 18, FIG. 19, and FIG. 20, an isolation insulating film ISF (insulator) is formed between the high voltage region HVR and the low voltage region LVR in the semiconductor device SDV according to the second embodiment. In the high voltage region HVR, the pad FPDF for the first semiconductor chip, the circuit FSC for the first semiconductor chip, the coil CL1$a$, the coil CL1$b$, and the like are arranged. In the low voltage region LVR, the pad FPDS for the second semiconductor chip, the pad FPDC for the second semiconductor chip, the dummy pad FDP, and the like are arranged.

For example, the isolation insulating film ISF is formed in a trench formed to have a predetermined depth from the first main surface of the first semiconductor substrate SUB1. The trench may be a shallow trench or a deep trench. Further, as the isolation insulating film ISF, an insulating film formed by the LOCOS (LOCal Oxidation of Silicon) method may be used.

Further, in the low voltage region LVR, an N-type well NWL (second conductivity type region) of a conductivity type opposite to that of the P-type first semiconductor substrate SUB1 is formed in the first semiconductor substrate SUB1. Since the other configurations are the same as those of the semiconductor device SDV shown in FIG. 6, FIG. 7, and FIG. 8, the same members are denoted by the same reference characters, and the description thereof will not be repeated unless necessary.

Next, a method of manufacturing the above-mentioned semiconductor device SDV will be briefly described. The isolation insulating film ISF and the N-type well NWL in the semiconductor device SDV are formed in the manufacturing process described in the first embodiment. Specifically, the isolation insulating film ISF and the N-type well NWL are formed in the step of forming the semiconductor element or the like constituting the circuit FSC for the first semiconductor chip on the first main surface of the first semiconductor substrate SUB1. For example, the isolation insulating film ISF is formed in the step of forming an element isolation insulating film that defines the region in which the semiconductor element is formed. The N-type well NWL is formed in the step of forming an impurity region or the like of the semiconductor element.

In the semiconductor device SDV according to the second embodiment, the following effects can be obtained in addition to the effects described in the first embodiment.

In the above-mentioned semiconductor device SDV, the isolation insulating film ISF is formed between the high voltage region HVR and the low voltage region LVR. In the low voltage region LVR, the N-type well NWL of a conductivity type opposite to that of the P-type first semiconductor substrate SUB1 is formed in the first semiconductor substrate SUB1.

Accordingly, the propagation of the noise (common mode noise) caused by the current flowing in the high voltage region HVR to the low voltage region LVR is blocked by the isolation insulating film ISF and the N-type well NWL (pn junction). As a result, it is possible to suppress the influence of the common mode noise on the current flowing in the low voltage region LVR, and it is possible to stabilize the operation of the second semiconductor chip SCP2 that controls the drive of the first semiconductor chip SCP1.

In the above-mentioned semiconductor device SDV, a structure for blocking common mode noise by the isolation insulating film ISF and the N-type well NWL has been described as an example. As long as it is possible to suppress the propagation of common mode noise from the high voltage region HVR to the low voltage region LVR, other structures may be applied other than the isolation insulating film ISF and the N-type well NWL.

Third Embodiment

As described above, in the first semiconductor chip SCP1, the high voltage region HVR to which a voltage of about several hundred volts (V) to one thousand and several hundred volts (V) is applied (supplied) and the low voltage region LVR to which a voltage of several volts (V) is applied (supplied) are present next to each other. Therefore, in the first multilayer wiring structure ML1 in the first semiconductor chip SCP1, it is conceivable that an electrical short circuit occurs between the conductive film arranged in the high voltage region HVR and the conductive film arranged in the low voltage region LVR, which are located in the same layer, due to the flow of current along the insulating interface. In the third embodiment, an example of a semiconductor device configured to suppress such an electrical short circuit will be described.

First Example

Figure 21:
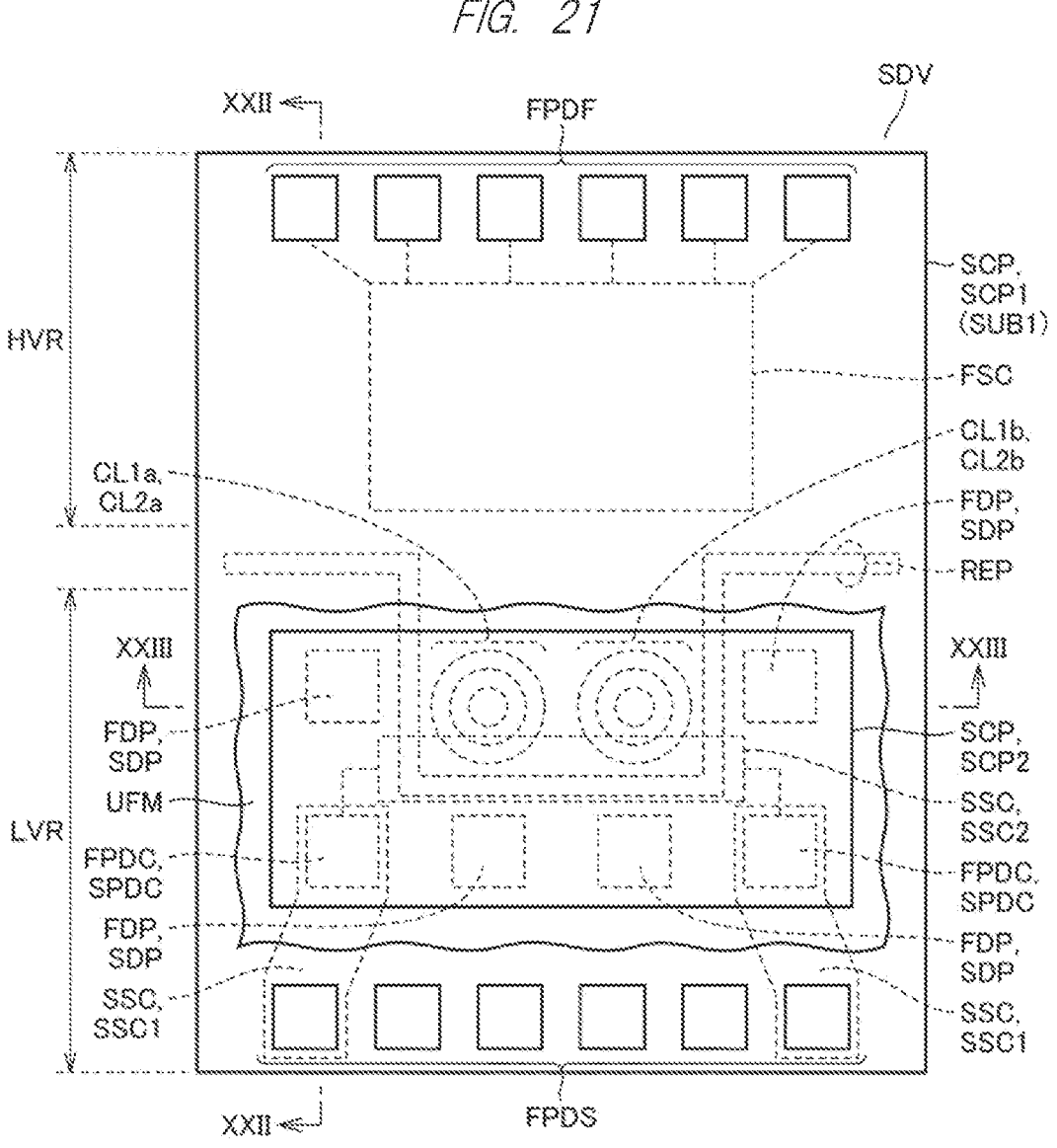
FIG. 21 is a plan view showing a structure of a first example and a second example of a semiconductor device according to the third embodiment.
Figure 22:
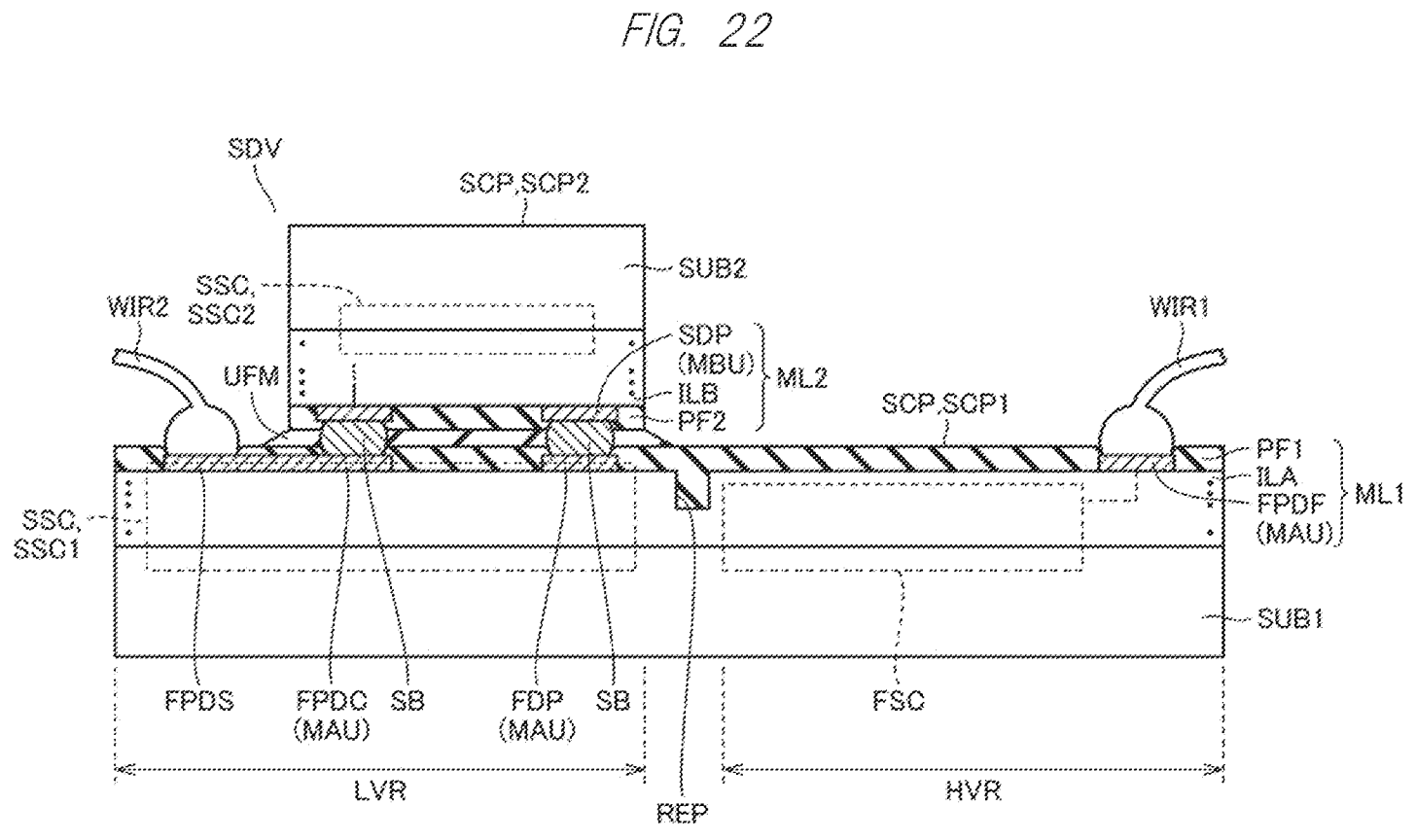
Figure 23:
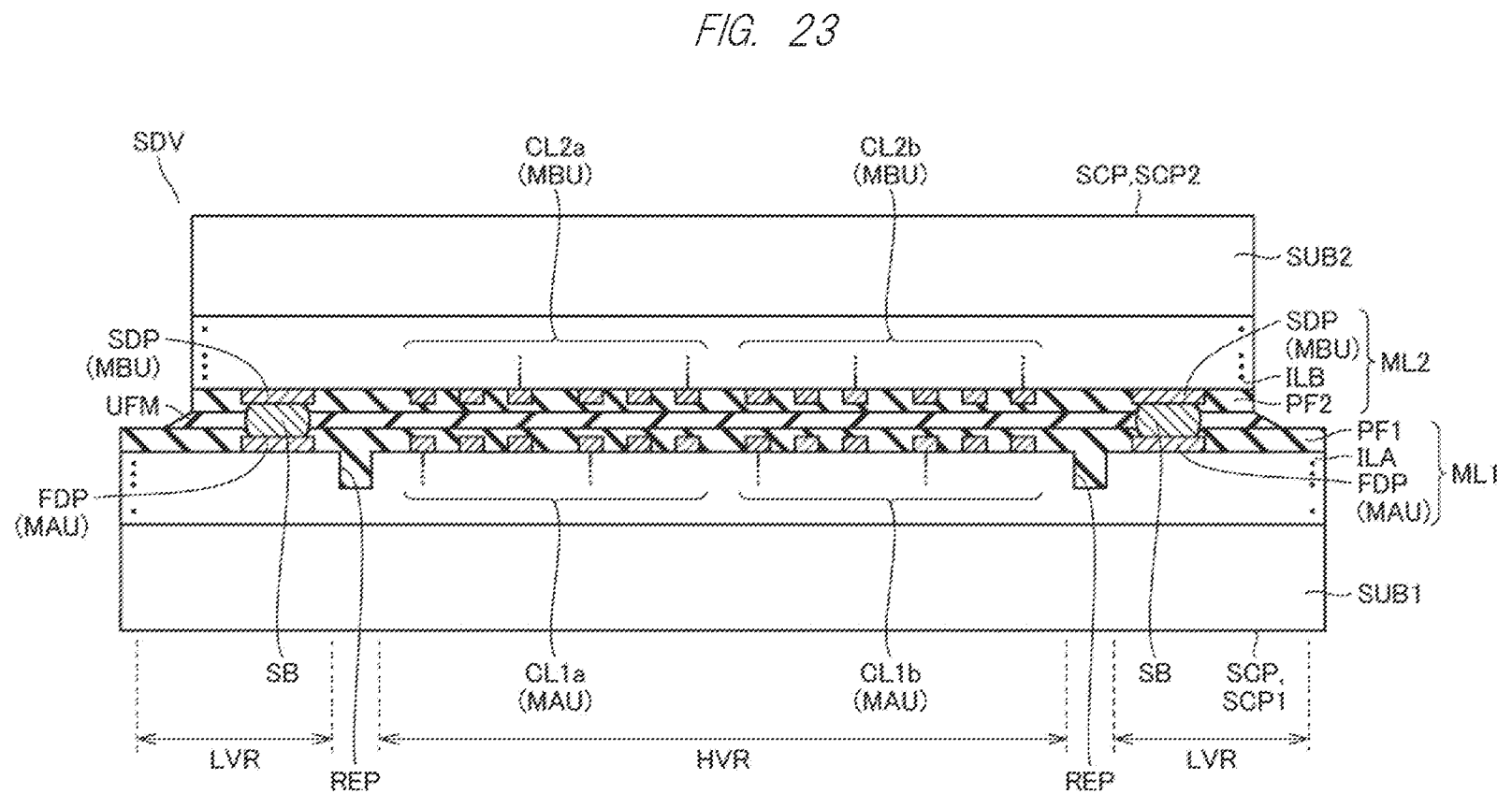

First, a case where an aluminum film is applied as the conductive film in the first multilayer wiring structure ML1 will be described. As shown in FIG. 21, FIG. 22, and FIG. 23, a recess portion REP (concave portion) is formed in a portion of the insulating film of the first multilayer wiring structure ML1 located between the high voltage region HVR and the low voltage region LVR. The recess portion REP is formed at least from the surface of an insulating film ILA of the insulating films in the first multilayer wiring structure ML1, on which the uppermost conductive film MAU located in the uppermost layer is formed, toward the first semiconductor substrate SUB1.

Specifically, in the case of a conductive film made of an aluminum film, the uppermost conductive film MAU is formed on the upper surface of the insulating film ILA. Therefore, the insulating film interface between the uppermost conductive film MAU arranged in the high voltage region HVR and the uppermost conductive film MAU arranged in the low voltage region LVR is located on the upper surface of the insulating film ILA which is at the same height as the lower surface of the uppermost conductive film MAU. The recess portion REP is formed at least from the upper surface of the insulating film ILA toward the first semiconductor substrate SUB1. Since the other configurations are the same as those of the semiconductor device SDV shown in FIG. 6, FIG. 7, and FIG. 8, the same members are denoted by the same reference characters, and the description thereof will not be repeated unless necessary.

Next, a method of manufacturing the above-mentioned semiconductor device SDV will be briefly described. The recess portion REP (concave portion) in the semiconductor device SDV is formed in the manufacturing process described in the first embodiment. Specifically, after the uppermost conductive film MAU made of an aluminum film is formed, photolithography process and etching process are performed to the insulating film ILA on which the uppermost conductive film MAU is formed, whereby the recess portion REP is formed from the upper surface of the insulating film ILA toward the first semiconductor substrate SUB1.

In the semiconductor device SDV according to the third embodiment (first example), the following effects can be obtained in addition to the effects described in the first embodiment.

In the above-mentioned semiconductor device SDV, in a portion of the first multilayer wiring structure ML1 located between the high voltage region HVR and the low voltage region LVR, the recess portion REP is formed at least from the upper surface of the insulating film ILA, on which the uppermost conductive film MAU is formed, toward the first semiconductor substrate SUB1. Therefore, the creepage distance along the insulating film interface between the uppermost conductive film MAU arranged in the high voltage region HVR and the uppermost conductive film MAU arranged in the low voltage region LVR becomes longer than that in the case where the recess portion REP is not formed.

Accordingly, it is possible to suppress the flow of current along the interface (upper surface) of the insulating film ILA from the uppermost conductive film MAU arranged in the high voltage region HVR to the uppermost conductive film MAU arranged in the low voltage region LVR. As a result, it is possible to suppress the occurrence of an electrical short circuit at least between the uppermost conductive film MAU arranged in the high voltage region HVR and the uppermost conductive film MAU arranged in the low voltage region LVR.

As for the conductive film located in the layer lower than the uppermost conductive film MAU, a recess portion may be formed in the upper surface of the insulating film in which the conductive film is formed, if necessary. By forming the recess portion, the creepage distance becomes long, and it is possible to suppress the occurrence of an electrical short circuit between the conductive film arranged in the high voltage region HVR and the conductive film arranged in the low voltage region LVR.

Second Example

Next, a case where a copper film is applied as the conductive film in the first multilayer wiring structure ML1 will be described.

Figure 24:
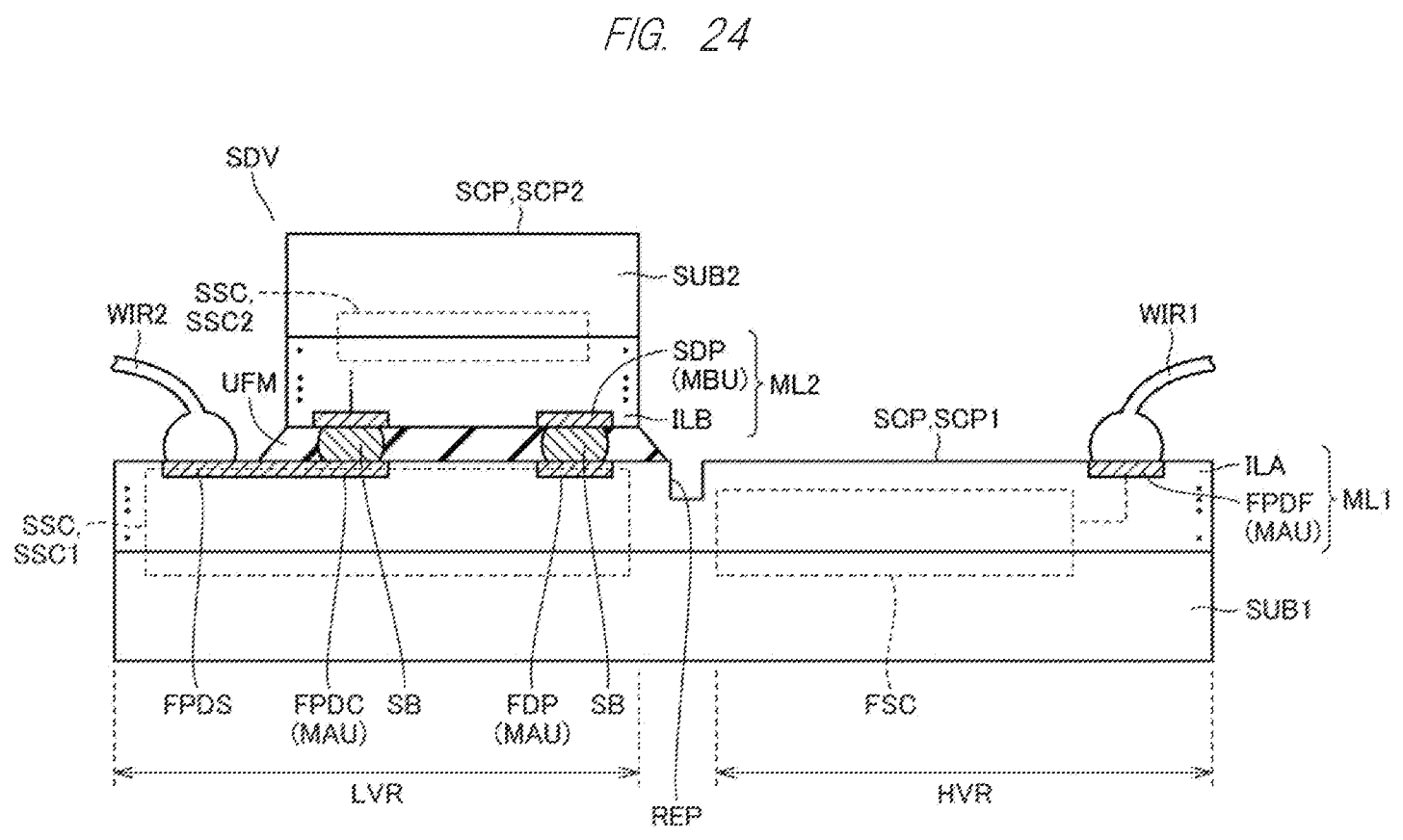
Figure 25:
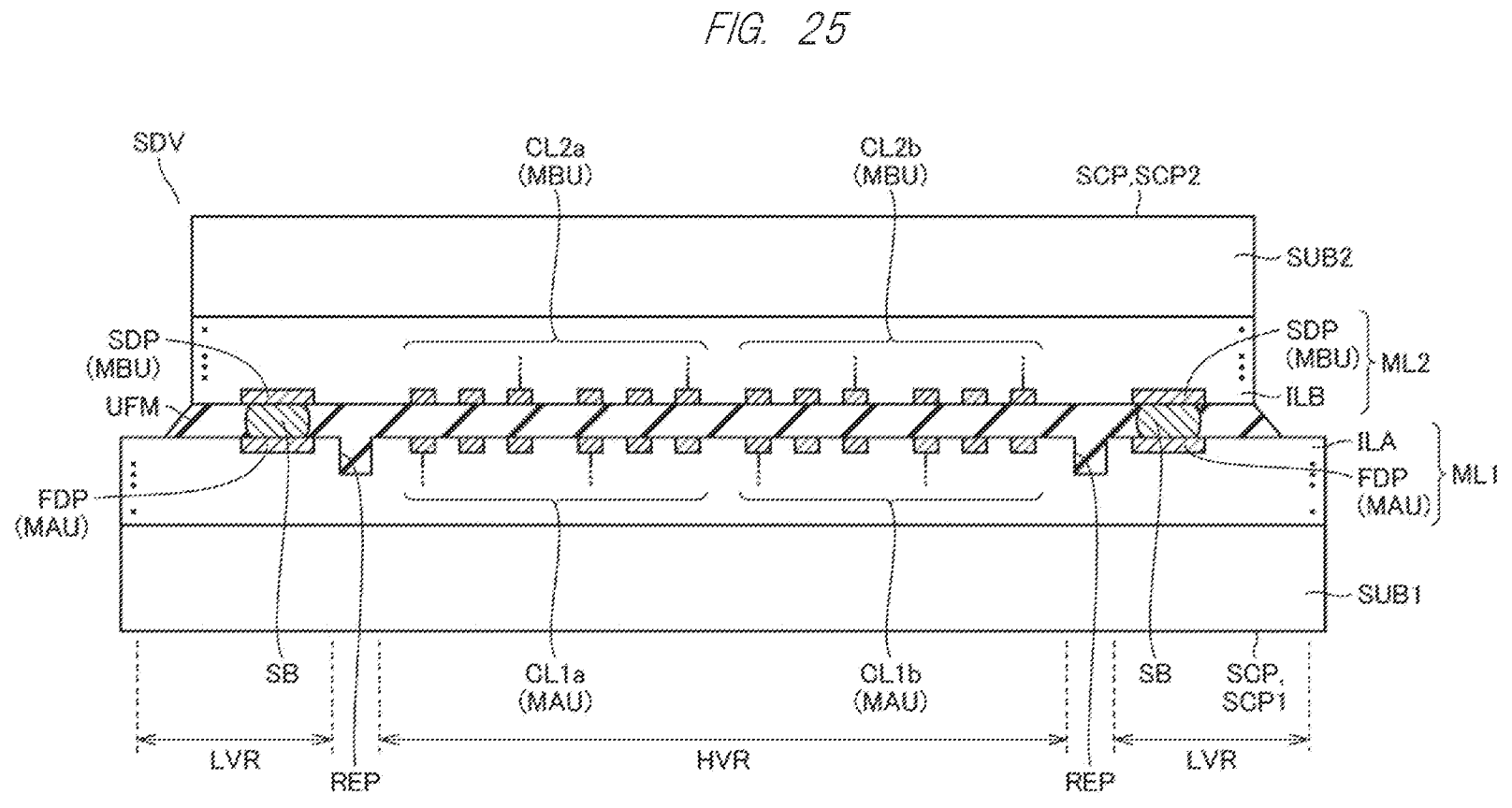

As shown in FIG. 24 and FIG. 25, a recess portion REP (concave portion) is formed in a portion of the insulating film of the first multilayer wiring structure ML1 located between the high voltage region HVR and the low voltage region LVR. The recess portion REP is formed at least from the surface of an insulating film ILA of the insulating films in the first multilayer wiring structure ML1, on which the uppermost conductive film MAU located in the uppermost layer is formed, toward the first semiconductor substrate SUB1.

Specifically, in the case of a conductive film made of a copper film, the uppermost conductive film MAU is buried in a wiring trench formed in the insulating film ILA by the damascene method. Therefore, the insulating film interface between the uppermost conductive film MAU arranged in the high voltage region HVR and the uppermost conductive film MAU arranged in the low voltage region LVR is located on the upper surface of the insulating film ILA which is at the same height as the upper surface of the uppermost conductive film MAU. The recess portion REP is formed at least from the surface of the insulating film ILA toward the first semiconductor substrate SUB1. Since the other configurations are the same as those of the semiconductor device SDV shown in FIG. 6, FIG. 7, and FIG. 8, the same members are denoted by the same reference characters, and the description thereof will not be repeated unless necessary.

Next, a method of manufacturing the above-mentioned semiconductor device SDV will be briefly described. The recess portion REP (concave portion) in the semiconductor device SDV is formed in the manufacturing process described in the first embodiment. Specifically, after the uppermost conductive film MAU made of a copper film is formed, photolithography process and etching process are performed to the insulating film ILA on which the uppermost conductive film MAU is formed, whereby the recess portion REP is formed from the upper surface of the insulating film ILA toward the first semiconductor substrate SUB1.

In the semiconductor device SDV according to the third embodiment (second example), the following effects can be obtained in addition to the effects described in the first embodiment.

In the above-mentioned semiconductor device SDV, in a portion of the first multilayer wiring structure ML1 located between the high voltage region HVR and the low voltage region LVR, the recess portion REP is formed at least from the upper surface of the insulating film ILA, on which the uppermost conductive film MAU is formed, toward the first semiconductor substrate SUB1. Therefore, the creepage distance along the insulating film interface between the uppermost conductive film MAU arranged in the high voltage region HVR and the uppermost conductive film MAU arranged in the low voltage region LVR becomes longer than that in the case where the recess portion REP is not formed.

Accordingly, it is possible to suppress the flow of current along the interface (upper surface) of the insulating film ILA from the uppermost conductive film MAU arranged in the high voltage region HVR to the uppermost conductive film MAU arranged in the low voltage region LVR. As a result, it is possible to suppress the occurrence of an electrical short circuit at least between the uppermost conductive film MAU arranged in the high voltage region HVR and the uppermost conductive film MAU arranged in the low voltage region LVR.

As for the conductive film located in the layer lower than the uppermost conductive film MAU, a recess portion may be formed in the upper surface of the insulating film in which the conductive film is formed, if necessary. By forming the recess portion, the creepage distance becomes long, and it is possible to suppress the occurrence of an electrical short circuit between the conductive film arranged in the high voltage region HVR and the conductive film arranged in the low voltage region LVR.

(Variations of Recess Portion (Concave Portion))

In each of the first example and the second example, the structure in which one recess portion REP (concave portion) is formed so as to extend in a portion of the insulating film of the first multilayer wiring structure ML1 located between the high voltage region HVR and the low voltage region LVR has been described.

Figure 26:
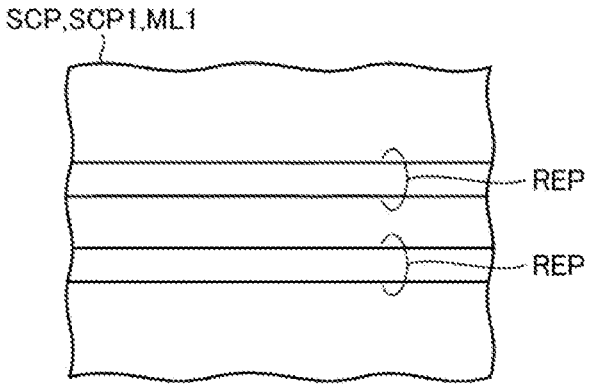
FIG. 26 is a partial plan view showing an example of a variation of a pattern of a recess portion formed in the semiconductor device in the third embodiment.
Figure 27:
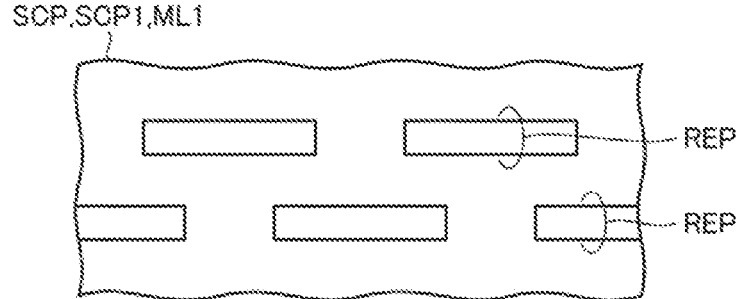
FIG. 27 is a partial plan view showing another example of the variation of the pattern of the recess portion formed in the semiconductor device in the third embodiment.

The structure of the recess portion REP is not limited to this, and a plurality of recess portions may be formed in order to further secure the creepage distance. As shown in FIG. 26, for example, two recess portions REP may be formed so as to extend in parallel at an interval. Alternatively, as shown in FIG. 27, a plurality of recess portions REP may be formed in a staggered manner.

The semiconductor devices described in the respective embodiments can be combined in various ways as needed. For example, the semiconductor device SDV according to the second embodiment and the semiconductor device SDV according to the third embodiment may be combined.

In the foregoing, the invention made by the inventors has been specifically described based on the embodiments, but it goes without saying that the invention is not limited to the embodiments described above and can be modified in various ways.

What is claimed is:

1. A semiconductor device comprising a first semiconductor chip and a second semiconductor chip, in which a first semiconductor circuit and a second semiconductor circuit are formed, wherein the first semiconductor chip includes:
    a first semiconductor substrate having a first main surface; and
    a first multilayer wiring structure which is formed on the first semiconductor substrate so as to cover the first main surface and in which a plurality of conductive films and a plurality of insulating films are stacked, wherein the second semiconductor chip includes:
    a second semiconductor substrate having a second main surface; and
    a second multilayer wiring structure which is formed on the second semiconductor substrate so as to cover the second main surface, wherein the second semiconductor circuit includes a first portion of the second semiconductor circuit and a second portion of the second semiconductor circuit, wherein the first semiconductor circuit and the first portion of the second semiconductor circuit are formed in the first semiconductor chip, wherein the second portion of the second semiconductor circuit electrically connected to the first portion of the second semiconductor circuit is formed in the second semiconductor chip, wherein the first multilayer wiring structure includes:
    a first inductor electrically connected to the first semiconductor circuit;
    a first electrode portion electrically connected to the first semiconductor circuit; and
    a second electrode portion electrically connected to the first portion of the second semiconductor circuit, wherein the second multilayer wiring structure includes a second inductor electrically connected to the second portion of the second semiconductor circuit, wherein the first multilayer wiring structure and the second multilayer wiring structure are joined such that the first inductor and the second inductor are overlapped in plan view showing the first main surface of the first semiconductor substrate, wherein the second semiconductor chip is joined to the first semiconductor chip such that the second semiconductor chip does not protrude from the first semiconductor chip and is not overlapped with the first electrode portion and the second electrode portion in plan view showing the first main surface of the first semiconductor substrate, wherein the first multilayer wiring structure includes at least three first dummy electrode portions which are not arranged in a straight line, wherein the second multilayer wiring structure includes at least three second dummy electrode portions which are not arranged in a straight line, wherein the at least three first dummy electrode portions and the at least three second dummy electrode portions are overlapped in plan view showing the first main surface of the first semiconductor substrate, wherein a second conductive member is interposed each between the at least three first dummy electrode portions and the at least three second dummy electrode portions, wherein, in the first semiconductor chip:

the first semiconductor circuit is operated by a first voltage;

the first portion of the second semiconductor circuit is operated by a second voltage lower than the first voltage;

the first semiconductor circuit, the first electrode portion and the first inductor are formed in a first region defined on the first main surface of the first semiconductor substrate; and the first portion of the second semiconductor circuit, the second electrode portion and the at least three second dummy electrode portions are formed in a second region defined on the first main surface of the first semiconductor substrate, and wherein an isolation insulating film is formed between the first region and the second region.

2. The semiconductor device according to claim 1, wherein the first multilayer wiring structure includes a third electrode portion electrically connected to the first portion of the second semiconductor circuit, wherein the second multilayer wiring structure includes a fourth electrode portion electrically connected to the second portion of the second semiconductor circuit and electrically connected to the third electrode portion, wherein the third electrode portion and the fourth electrode portion are overlapped in plan view showing the first main surface of the first semiconductor substrate, and wherein a first conductive member is interposed between the third electrode portion and the fourth electrode portion.

3. The semiconductor device according to claim 1, wherein a noise blocking portion configured to block propagation of an electrical noise generated in the first semiconductor circuit to which the first voltage is supplied, to the first portion of the second semiconductor circuit is formed between the first region and the second region in the first semiconductor substrate.

4. The semiconductor device according to claim 3, wherein the noise blocking portion includes:

an insulator formed from the first main surface of the first semiconductor substrate to a predetermined depth; and a second conductivity type region formed from the insulator to the second region of the first semiconductor substrate, in the first semiconductor substrate of a first conductivity type.

5. The semiconductor device according to claim 1, wherein the plurality of conductive films include an uppermost conductive film farthest from the first main surface of the first semiconductor substrate, and wherein a recess portion is formed at least in a portion of one insulating film of the plurality of insulating films, on which the uppermost conductive film is formed, the portion being located between the first region and the second region.

6. The semiconductor device according to claim 5, wherein the uppermost conductive film includes an aluminum film, and wherein the recess portion is formed from an upper surface of the one insulating film in contact with a lower surface of the uppermost conductive film to a side on which the first main surface is located.

7. The semiconductor device according to claim 5, wherein the uppermost conductive film includes a copper film, and wherein the recess portion is formed from an upper surface of the one insulating film located at the same height as an upper surface of the uppermost conductive film to a side on which the first main surface is located.

8. The semiconductor device according to claim 5, wherein the uppermost conductive film includes the first electrode portion and the second electrode portion.

9. The semiconductor device according to claim 8, wherein the uppermost conductive film includes the first inductor.

* * * * *